United States Patent
Setta

(10) Patent No.: US 11,626,376 B2
(45) Date of Patent: Apr. 11, 2023

(54) SEMICONDUCTOR DEVICE HAVING A PLURALITY OF FIRST STRUCTURAL BODIES PROVIDED BELOW A CONNECTION TERMINAL AND MANUFACTURING METHOD THEREOF

(71) Applicant: Kioxia Corporation, Tokyo (JP)

(72) Inventor: Yuji Setta, Kuwana (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/350,899

(22) Filed: Jun. 17, 2021

(65) Prior Publication Data
US 2022/0077090 A1    Mar. 10, 2022

(30) Foreign Application Priority Data

Sep. 8, 2020  (JP) .............................. JP2020-150749

(51) Int. Cl.
*H01L 23/00*         (2006.01)
*H01L 25/065*        (2006.01)
(Continued)

(52) U.S. Cl.
CPC .............. *H01L 24/08* (2013.01); *H01L 24/05* (2013.01); *H01L 24/80* (2013.01); *H01L 25/0657* (2013.01); *H01L 25/18* (2013.01); *H01L 25/50* (2013.01); *H01L 2224/04042* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ......... H01L 24/08; H01L 24/05; H01L 24/80; H01L 2224/04042; H01L 2224/08145; H01L 2225/06541
See application file for complete search history.

(56) References Cited

U.S. PATENT DOCUMENTS 10,026,769 B2     7/2018  Kagawa et al.
10,727,215 B1 *   7/2020  Zhang ..................... H01L 24/08
(Continued)

FOREIGN PATENT DOCUMENTS

JP     11-354562 A    12/1999
JP     3645450 B2      5/2005
(Continued)

*Primary Examiner* — Mamadou L Diallo
(74) *Attorney, Agent, or Firm* — Oblon, McClelland, Maier & Neustadt, L.L.P.

(57) ABSTRACT

A semiconductor device of an embodiment includes a first chip having a memory cell array, and a second chip having a control circuit. The first chip includes a substrate, a pad, a first structural body, and a second structural body. The substrate is arranged on the side opposite to a joined face of the first chip joined to the second chip, and includes a first face, a second face, and an opening extending from the second face to the first face in a first region. The memory cell array is provided between the first face and the opposed joined face. The pad is provided in the opening. The first structural body is provided between the first face and the joined face, and is electrically connected to the pad. The second structural body is provided between the first face and the joined face in the first region.

17 Claims, 23 Drawing Sheets

(51) Int. Cl.
    *H01L 25/18*       (2006.01)
    *H01L 25/00*       (2006.01)

(56) References Cited

U.S. PATENT DOCUMENTS

| | | | |
|---|---|---|---|
| 11,049,870 B2 | 6/2021 | Sugisaki | |
| 2016/0079164 A1* | 3/2016 | Fukuzumi | H01L 27/11582 438/107 |
| 2018/0261575 A1* | 9/2018 | Tagami | H01L 27/11556 |
| 2019/0363079 A1* | 11/2019 | Thei | H01L 24/03 |
| 2020/0126920 A1 | 4/2020 | Huang et al. | |
| 2020/0203329 A1* | 6/2020 | Kanamori | H01L 27/11573 |
| 2020/0243486 A1* | 7/2020 | Quader | G06N 3/063 |
| 2020/0295037 A1* | 9/2020 | Iijima | H01L 27/11573 |
| 2020/0328180 A1* | 10/2020 | Cheng | H01L 24/80 |
| 2020/0328186 A1* | 10/2020 | Liu | G11C 11/005 |
| 2020/0402903 A1* | 12/2020 | Chen | H01L 23/5329 |
| 2021/0013088 A1* | 1/2021 | Chen | H01L 24/94 |
| 2021/0028148 A1* | 1/2021 | Wu | H01L 21/7682 |
| 2021/0036006 A1* | 2/2021 | Chen | H01L 24/83 |
| 2021/0057427 A1* | 2/2021 | Oh | H01L 23/5225 |
| 2021/0111137 A1* | 4/2021 | Chen | H01L 24/08 |
| 2021/0202458 A1* | 7/2021 | Jung | H01L 25/0657 |
| 2021/0233900 A1* | 7/2021 | Kim | H01L 23/481 |
| 2021/0375829 A1* | 12/2021 | Or-Bach | H01L 23/66 |
| 2021/0375847 A1* | 12/2021 | Chibvongodze | G11C 5/025 |

FOREIGN PATENT DOCUMENTS

| | | |
|---|---|---|
| JP | 2006-339406 A | 12/2006 |
| JP | 2014-116561 A | 6/2014 |
| JP | 5976055 B2 | 8/2016 |
| JP | 2018-73967 A | 5/2018 |
| JP | 6429091 B2 | 11/2018 |
| TW | 202013684 A | 4/2020 |

\* cited by examiner

SEMICONDUCTOR DEVICE HAVING A PLURALITY OF FIRST STRUCTURAL BODIES PROVIDED BELOW A CONNECTION TERMINAL AND MANUFACTURING METHOD THEREOF

CROSS REFERENCE TO RELATED APPLICATIONS

This application is based upon and claims the benefit of priority from the prior Japanese Patent Application No. 2020-150749, filed on Sep. 8, 2020, the entire contents of which are incorporated herein by reference.

FIELD

The embodiments of the present invention relate to a semiconductor device and a manufacturing method thereof.

BACKGROUND

In recent years, hybrid bonding technology for bonding together two wafers, which have semiconductor elements formed therein, has been introduced for CMOS (Complementary Metal Oxide Semiconductor) image sensors and nonvolatile semiconductor memories. In such cases, an electrode pad for wire bonding for connection to the outside is formed such that the electrode pad is exposed at the uppermost surface of the resulting chip after a substrate has been made thin, for example.

However, there is a possibility that mechanical stress that would be applied during wire bonding may damage the semiconductor elements, wires, and the like.

DETAILED DESCRIPTION

Figure 1:
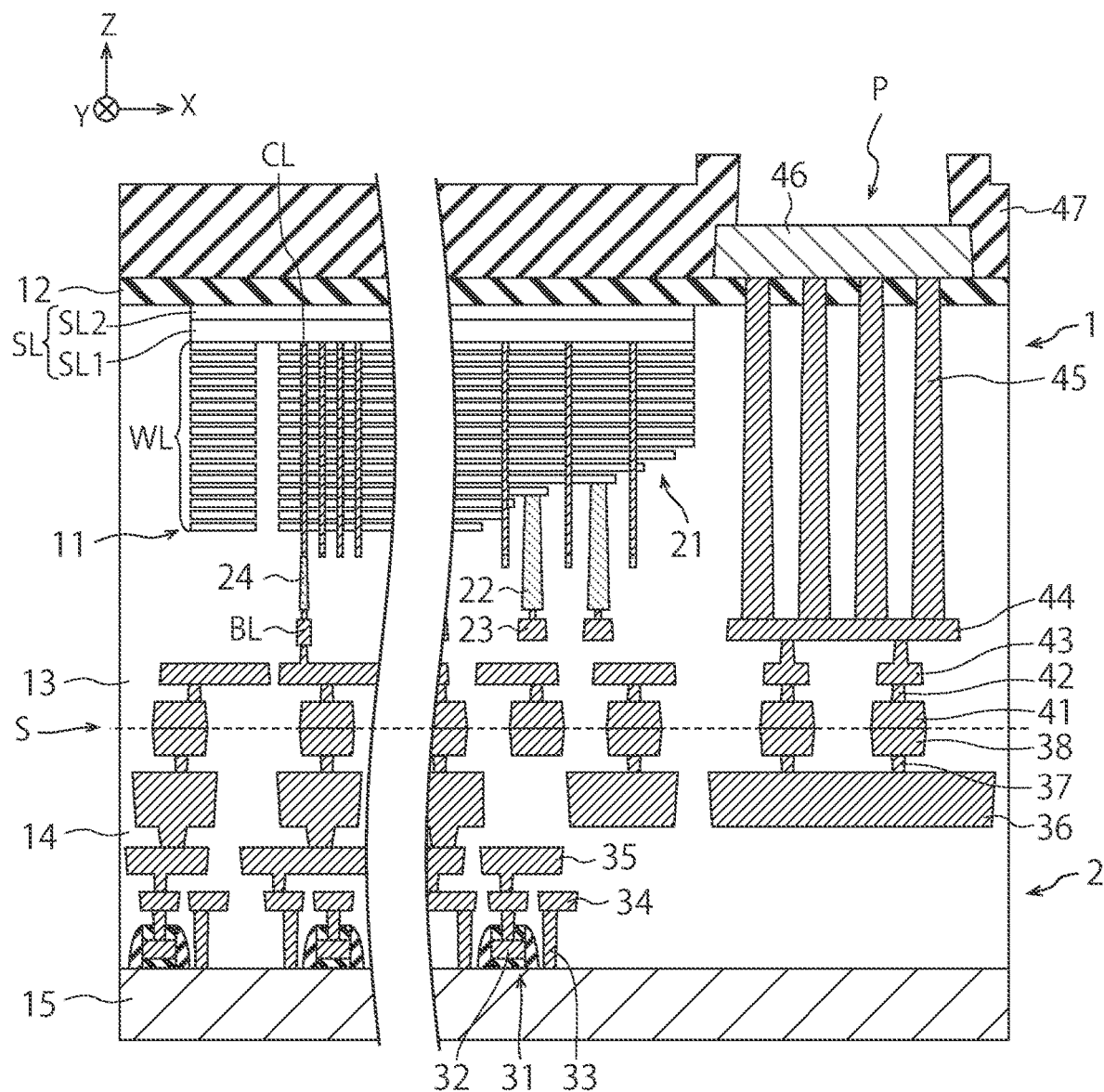
FIG. 1 is a cross-sectional view illustrating an exemplary structure of a semiconductor device.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to the present embodiment includes a first chip having a memory cell array, and a second chip joined to the first chip and having a control circuit, the control circuit being configured to control the memory cell array. The first chip includes a substrate, a pad, a first structural body, and a second structural body. The substrate is arranged on the side opposite to a joined face of the first chip joined to the second chip, and includes a first face, a second face on the side opposite to the first face, and an opening extending from the second face to the first face in a first region. The memory cell array is provided between the first face and the opposed joined face. The pad is provided in the opening. The first structural body is provided between the first face and the joined face, and is electrically connected to the pad. The second structural body is provided between the first face and the joined face in the first region.

First Embodiment

FIG. 1 is a cross-sectional view illustrating an exemplary structure of a semiconductor device. The semiconductor device of FIG. 1 is a three-dimensional memory having an array chip 1 and a circuit chip 2 bonded together. The array chip 1 is an example of the first chip, and the circuit chip 2 is an example of the second chip.

The array chip 1 has a memory cell array 11 including a plurality of memory cells, an insulating film 12 above the memory cell array 11, and an interlayer dielectric 13 below the memory cell array 11. The insulating film 12 is a silicon oxide film or a silicon nitride film, for example. The interlayer dielectric 13 is a silicon oxide film or a stacked film of a silicon oxide film and another insulating film, for example.

The circuit chip 2 is provided below the array chip 1. Reference symbol S denotes the bonded face of the array chip 1 and the circuit chip 2. The bonded face S is an example of a first bonded face. The circuit chip 2 includes an interlayer dielectric 14 and a substrate 15 below the interlayer dielectric 14. The interlayer dielectric 14 is a silicon oxide film or a stacked film of a silicon oxide film and another insulating film, for example. The substrate 15 is a semiconductor substrate, such as a silicon substrate, for example.

FIG. 1 illustrates the X-direction and the Y-direction that are parallel to the surface of the substrate 15 and are perpendicular to each other, and the Z-direction that is perpendicular to the surface of the substrate 15. In this specification, the +Z-direction is handled as the upward direction, and the −Z-direction is handled as the downward direction. The −Z-direction may either coincide or not coincide with the direction of gravity.

The array chip 1 includes a plurality of word lines WL and a source line SL as the electrode layers in the memory cell array 11. FIG. 1 illustrates a stepped structure portion 21 of the memory cell array 11. Each word line WL is electrically connected to a word wire layer 23 via a contact plug 22. Each columnar portion CL penetrating the plurality of word lines WL is electrically connected to a bit line BL via a via plug 24, and is also electrically connected to the source line SL. The source line SL includes a first layer SL1 as a semiconductor layer and a second layer SL2 as a metal layer.

The circuit chip 2 includes a plurality of transistors 31. Each transistor 31 includes a gate electrode 32 provided on the substrate 15 with a gate insulating film interposed therebetween, and source and drain diffusion layers (not illustrated) provided in the substrate 15. The circuit chip 2 also includes a plurality of contact plugs 33 provided on the gate electrodes 32 or the source or drain diffusion layers of the transistors 31, a wire layer 34 provided on the contact plugs 33 and including a plurality of wires, and a wire layer 35 provided on the wire layer 34 and including a plurality of wires.

The circuit chip 2 further includes a wire layer 36 provided on the wire layer 35 and including a plurality of wires, a plurality of via plugs 37 provided on the wire layer 36, and a plurality of metal pads 38 (i.e., second bond pads) provided on the via plugs 37. The metal pads 38 are Cu (copper) layers or Al (aluminum) layers, for example. The circuit chip 2 functions as a control circuit (i.e., a logic circuit) that controls the operation of the array chip 1. The control circuit includes the transistors 31 and the like, and is electrically connected to the metal pads 38.

The array chip 1 includes a plurality of metal pads 41 (i.e., first bond pads) provided on the metal pads 38, and a plurality of via plugs 42 provided on the metal pads 41. The array chip 1 also includes a wire layer 43 provided on the via plugs 42 and including a plurality of wires, and a wire layer 44 provided on the wire layer 43 and including a plurality of wires. The metal pads 41 are Cu layers or Al layers, for example.

The array chip 1 further includes a plurality of via plugs 45 provided on the wire layer 44, a metal pad 46 (i.e., a connection terminal) provided on the via plugs 45 and on the insulating film 12, and a passivation film 47 provided on the metal pad 46 and on the insulating film 12. The metal pad 46 is a Cu layer or an Al layer, for example, and functions as an external connection pad (i.e., a bonding pad) of the semiconductor device in FIG. 1. The passivation film 47 is an insulating film, such as a silicon oxide film, for example, and has an opening P (i.e., a connection terminal region) for exposing the upper face of the metal pad 46. The metal pad 46 can be connected to a substrate for mounting or to another device via the opening P using a bonding wire, a solder ball, or a metal bump, for example.

Figure 2:
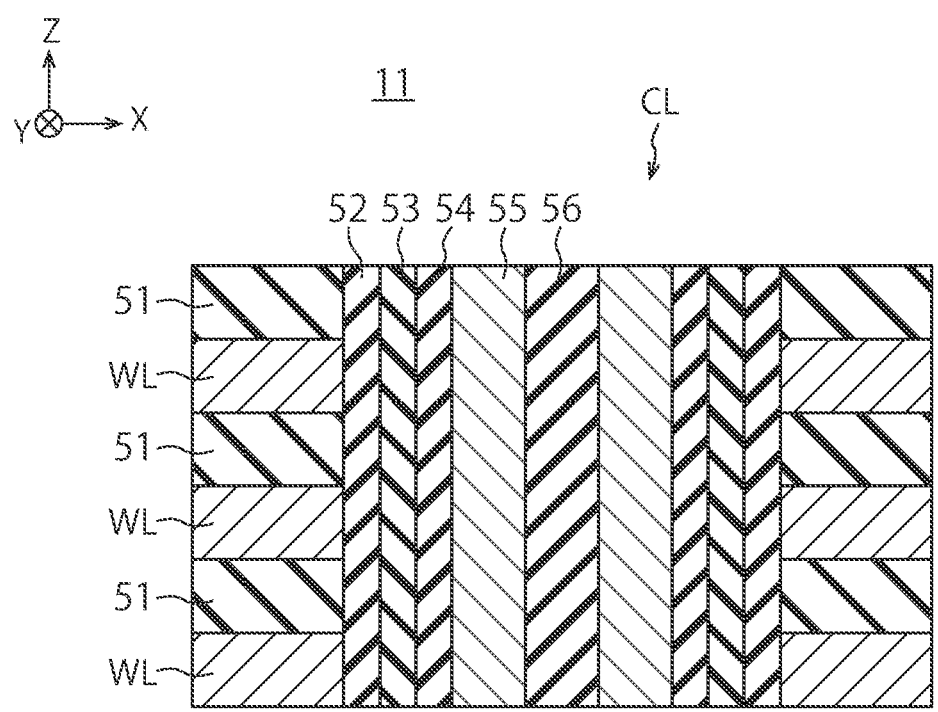
FIG. 2 is a cross-sectional view illustrating an exemplary structure of a columnar portion.

FIG. 2 is a cross-sectional view illustrating an exemplary structure of each columnar portion CL.

As illustrated in FIG. 2, the memory cell array 11 includes a plurality of word lines WL and a plurality of insulating layers 51 that are alternately stacked on the interlayer dielectric 13 (FIG. 1). The word lines WL are W (tungsten) layers, for example. The insulating layers 51 are silicon oxide films, for example.

The columnar portion CL includes a block insulating film 52, a charge storage layer 53, a tunnel insulating film 54, a channel semiconductor layer 55, and a core insulating film 56 that are stacked in this order. The charge storage layer 53 is a silicon nitride film, for example, and is formed on side faces of the word lines WL and the insulating layers 51 with the block insulating film 52 interposed therebetween. The charge storage layer 53 may be a semiconductor layer, such as a polysilicon layer. The channel semiconductor layer 55 is a polysilicon layer, for example, and is formed on a side face of the charge storage layer 53 with the tunnel insulating film 54 interposed therebetween. The block insulating film 52, the tunnel insulating film 54, and the core insulating film 56 are silicon oxide films or metal insulating films, for example.

Figure 3:
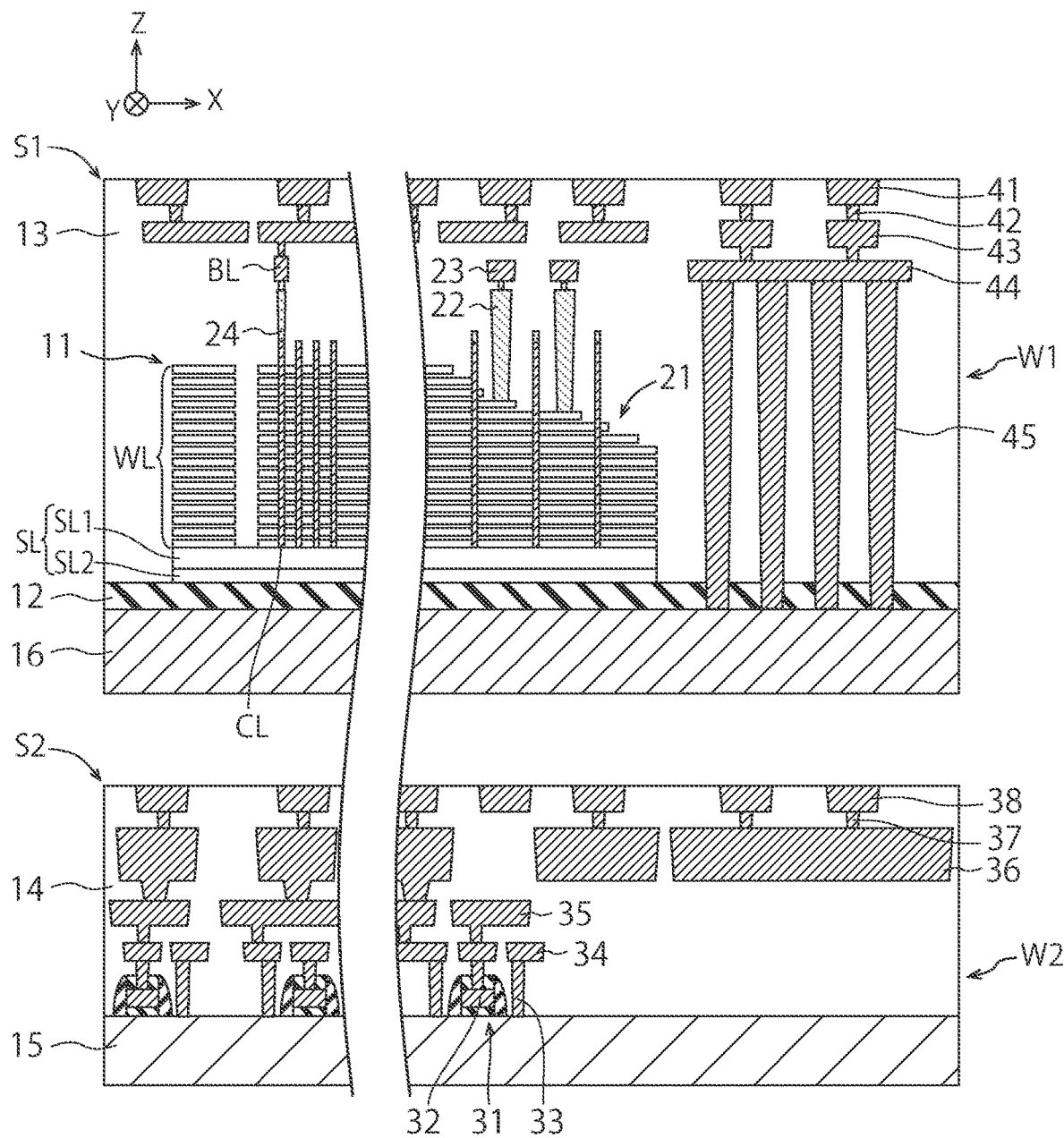
FIG. 3 is a cross-sectional view illustrating an exemplary method of manufacturing a semiconductor device.
Figure 4:
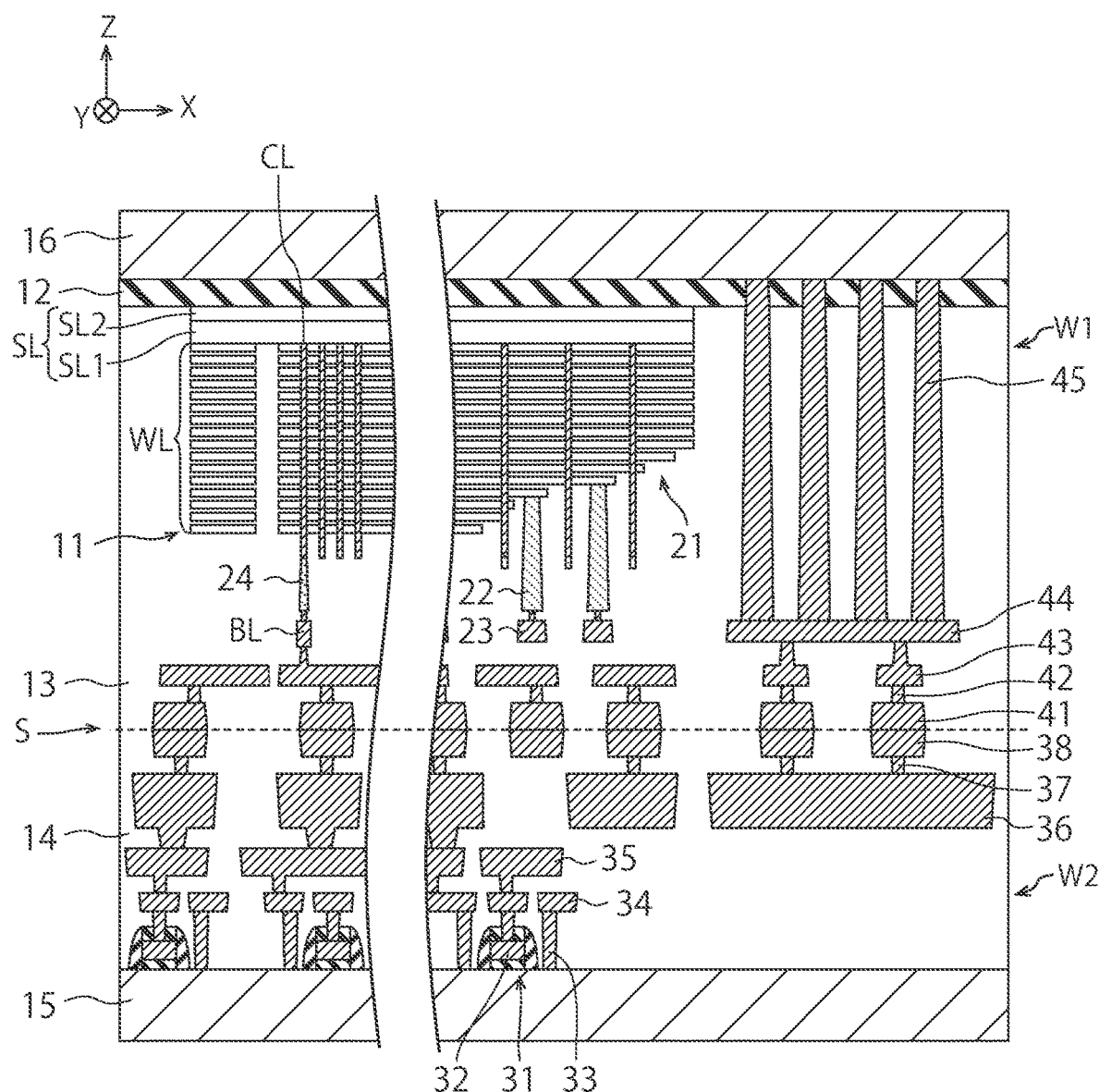
FIG. 4 is a cross-sectional view illustrating an exemplary method of manufacturing a semiconductor device.

FIGS. 3 and 4 are cross-sectional views each illustrating an exemplary method of manufacturing a semiconductor device.

FIG. 3 illustrates an array wafer W1 including a plurality of array chips 1, and a circuit wafer W2 including a plurality of circuit chips 2. The array wafer W1 is also referred to as a "memory wafer" and the circuit wafer W2 is also referred to as a "CMOS wafer." The array wafer W1 is an example of a first wafer, and the circuit wafer W2 is an example of a second wafer.

It should be noted that the orientation of the array wafer W1 in FIG. 3 is opposite to that of the array chip 1 in FIG. 1. In the present embodiment, a semiconductor device is manufactured by bonding the array wafer W1 and the circuit wafer W2 together. FIG. 3 illustrates the array wafer W1 that is not yet inverted in orientation for bonding purposes, while FIG. 1 illustrates the array chip 1 obtained by inverting the orientation of the array wafer W1 for bonding purposes, bonding the array wafer W1 to the circuit wafer W2, and dicing the bonded wafers.

In FIG. 3, symbol S1 denotes the upper face of the array wafer W1, and symbol S2 denotes the upper face of the circuit wafer W2. It should be noted that the array wafer W1 includes the substrate 16 provided below the insulating film 12. The substrate 16 is a semiconductor substrate, such as a silicon substrate, for example.

In the present embodiment, as illustrated in FIG. 3, the memory cell array 11, the insulating film 12, the interlayer dielectric 13, the stepped structure portion 21, the metal pads 41, and the like are formed first on the substrate 16 of the array wafer W1. Then, the interlayer dielectric 14, the transistors 31, the metal pads 38, and the like are formed on the substrate 15 of the circuit wafer W2. For example, the via plugs 45, the wire layer 44, the wire layer 43, the via plugs 42, and the metal pads 41 are sequentially formed on the substrate 16. In addition, the contact plugs 33, the wire layer 34, the wire layer 35, the wire layer 36, the via plugs 37, and the metal pads 38 are sequentially formed on the substrate 15. Next, as illustrated in FIG. 4, the array wafer W1 and the circuit wafer W2 are bonded together with mechanical pressure applied thereto. Accordingly, the interlayer dielectric 13 and the interlayer dielectric 14 are bonded together. Next, the array wafer W1 and the circuit wafer W2 are annealed at 400° C. Accordingly, the metal pads 41 and the metal pads 38 are joined together.

After that, the substrate 15 is made thin by CMP (Chemical Mechanical Polishing), and the substrate 16 is removed by CMP. Then, the array wafer W1 and the circuit wafer W2 are cut into a plurality of chips. In this manner, the semiconductor device of FIG. 1 is manufactured. FIG. 1 illustrates the circuit chip 2 including the metal pads 38, and the array chip 1 including the metal pads 41 arranged on the metal pads 38. It should be noted that the metal pad 46 and the passivation film 47 are formed on the insulating film 12 after the substrate 15 has been made thin and the substrate 16 has been removed, for example.

Although the present embodiment illustrates bonding the array wafer W1 and the circuit wafer W2 together, it is also possible to bond two array wafers W1 together, instead. The descriptions made with reference to FIGS. 1 to 4 and descriptions to be made below with reference to FIGS. 5 to 27 are also applicable to bonding of two array wafers W1 together.

Although FIG. 1 illustrates the interface between the interlayer dielectric 13 and the interlayer dielectric 14 and the interfaces between the metal pads 41 and the metal pads 38, it is common that such interfaces will not be observed after the aforementioned annealing is performed. However, the positions of such interfaces can be estimated by detecting the inclinations of the side faces of the metal pads 41 and the metal pads 38 or detecting positional displacement between the side faces of the metal pads 41 and the metal pads 38, for example.

The semiconductor device of the present embodiment may be shipped for transactions either in the state of FIG. 1 (i.e., after the bonded wafers have been cut into a plurality of chips) or in the state of FIG. 4 (i.e., before the bonded wafers are cut into a plurality of chips). FIG. 1 illustrates a chip-form semiconductor device, and FIG. 4 illustrates a wafer-form semiconductor device. In the present embodiment, a plurality of chip-form semiconductor devices (FIG. 1) are manufactured from a single wafer-form semiconductor device (FIG. 4).

Hereinafter, the details of the array chip 1 of the present embodiment will be described with reference to FIGS. 5 to 27. Specifically, the details of the metal pad 46 and a structure around the metal pad 46 according to the present embodiment will be described. The following description is also applicable to the circuit wafer W2 of the present embodiment.

Figure 5:
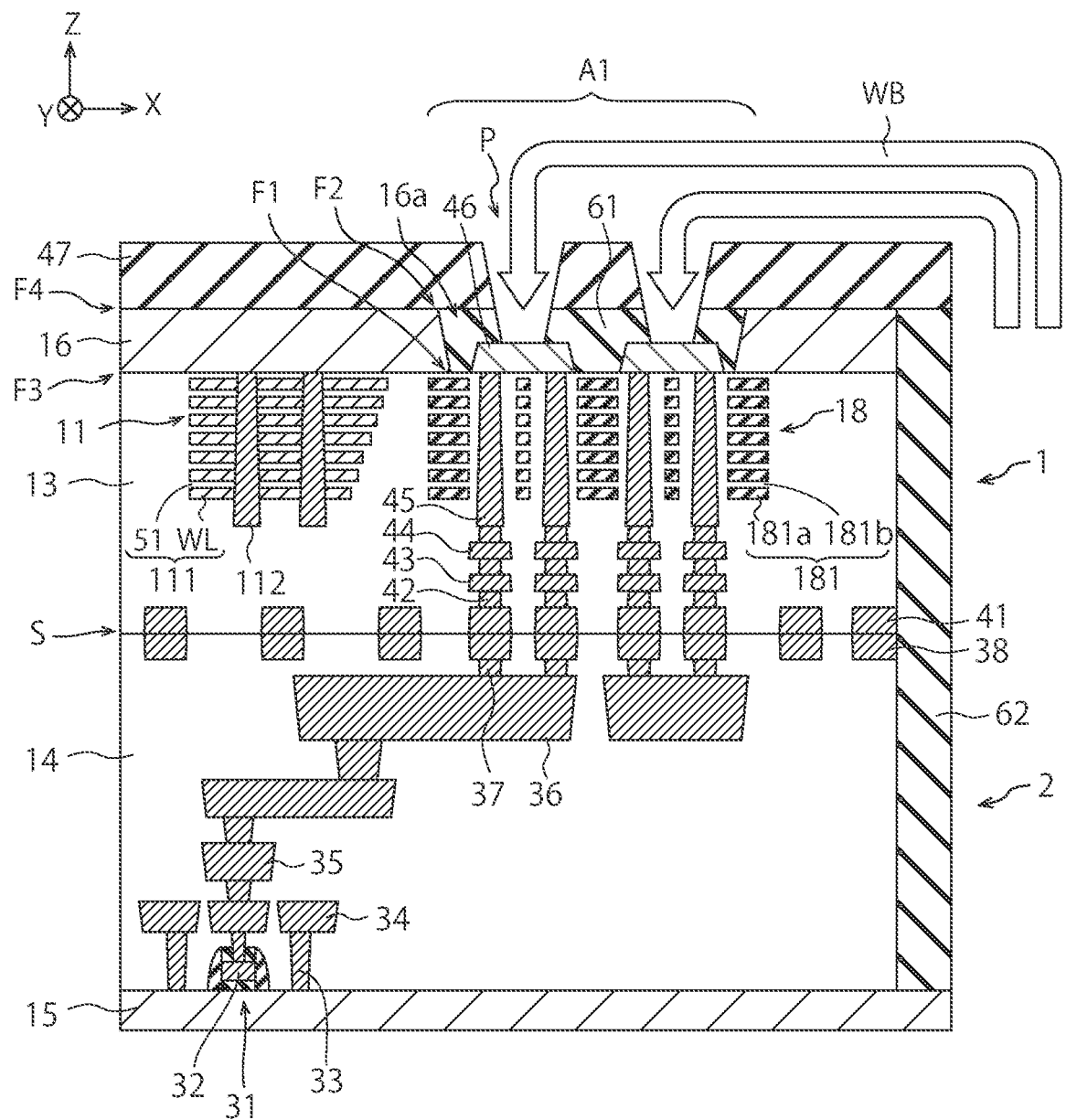
FIG. 5 is a cross-sectional view illustrating the configuration of a semiconductor device according to a first embodiment.

FIG. 5 is a cross-sectional view illustrating the configuration of the semiconductor device according to the first embodiment.

In FIG. 5, the substrate 16 illustrated in FIG. 4 has not been completely removed but has been made thin in contrast to the configuration illustrated in FIG. 1. In addition, the insulating film 12 and the source line SL illustrated in FIG. 1 are omitted in FIG. 5. Further, in FIG. 5, a structural body 18 and insulating layers 61 and 62 are provided. Reference numeral 111 denotes a stack of the memory cell array 11, and reference numeral 112 denotes columnar portions of the memory cell array 11.

As illustrated in FIG. 5, the array chip 1 includes the substrate 16, the metal pads 46, the via plugs 45, the structural body 18, and the insulating layers 61 and 62.

The substrate 16 is arranged on the side opposite to the face S bonded (joined) to the circuit chip 2. The substrate 16 includes a face F3 and a face F4 on the side opposite thereto. The face F3 is a face that is opposite the bonded face S, and the memory cell array 11 is provided between the face F3 and the bonded face S. In addition, the substrate 16 further includes an opening 16a extending from the face F4 to the face F3 in a region A1. The region A1 is a region where wires are to be formed by wire bonding WB as described later.

The metal pads 46 are provided in the opening 16a. The metal pads 46 are electrically connected to bonding wires by wire bonding WB in the region A1. In the example illustrated in FIG. 5, two metal pads 46 are provided. However, the number of metal pads 46 is not limited thereto. The material of the metal pads 46 is aluminum (Al), for example.

The via plugs 45 are provided between a face F1 of the insulating layer 61 and the bonded face S and are electrically connected to the metal pads 46. In addition, as illustrated in FIG. 5, the via plugs 45 are also connected to the transistors 31 partially forming the control circuit. That is, the via plugs 45 are electrically connected to the control circuit provided in the circuit chip 2. The via plugs 45 are formed substantially concurrently with the columnar portions 112 (e.g., the contact plugs 22 in FIG. 1) of the memory cell array 11, for example. Thus, the material of the via plugs 45 is the same as that of the contact plugs 22, such as tungsten, for example. It should be noted that the shape of each via plug 45 is not limited to a column, and may be a structural body with other shapes. Such a structural body may include a wire layer connected to the via plug 45, for example.

The structural body 18 is provided between the face F1 of the insulating layer 61 and the bonded face S in the region A1.

As described above, a method of forming wires on the metal pads 46 by wire bonding WB is known as one of the methods for connecting the semiconductor device to an external substrate for mounting or to an external device, for example. When wire bonding WB is performed, a load is applied to the metal pads 46 for a given period of time by a bonding tool, such as a capillary, for example. Thus, stress would be applied to the semiconductor device during wire bonding. Herein, the metal pads 46 to be electrically connected to the transistors 31 are provided after the substrate 16 has been partially removed as illustrated in the region A1. Thus, there is a possibility that the strength of the region A1 may decrease. For example, there is a possibility that the memory cell array 11, the transistors 31, the via plugs 45, the wire layers, or the like arranged immediately below or around the opening 16a may become mechanically damaged due to stress.

Thus, in the first embodiment, the structural body 18, which functions as a stress countermeasure film during wire bonding, is provided immediately below the opening 16a. The structural body 18 has a highly stiff or robust structure, for example. Accordingly, load resistance and impact resistance can be improved. This can alleviate the influence of stress to be applied to the inside of the semiconductor device during wire bonding.

In the example illustrated in FIG. 5, the structural body 18 is a stack formed corresponding to the stack 111 of the memory cell array 11. As described with reference to FIG. 2, the memory cell array 11 has the stack 111 including a plurality of word lines WL (i.e., conductive layers) and a plurality of insulating layers 51 that are alternately stacked in the Z-direction perpendicular to the face F1 of the insulating layer 61. Thus, the structural body 18 has a stack 181 including two types of insulating layers: 181a and 181b that are alternately stacked corresponding to the stack 111. This is because the structural body 18 (or the stack 181) is formed substantially concurrently with the memory cell array 11 in the step of forming the memory cell array 11. Therefore, each insulating layer 181a has substantially the same position with respect to the face F1 of the insulating layer 61 as well as the same thickness as each word line WL. In addition, each insulating layer 181b has substantially the same position with respect to the face F1 of the insulating layer 61 as well as the same thickness as each insulating layer 51.

One of the two types of insulating layers: 181a and 181b of the stack 181 is the same as each insulating layer 51 of the stack 111. In the example illustrated in FIG. 5, each insulating layer 181b is a silicon oxide film, for example. Thus, the material of each insulating layer 181b is the same as that of each insulating layer 51. Meanwhile, each insulating layer 181a is a silicon nitride film, for example. Silicon nitride (SiN) has a higher strength than silicon oxide (SiO$_2$) of the interlayer dielectric 13. Accordingly, the structural body 18 has a high strength.

Herein, as a method for forming the stack 111 of the memory cell array 11, for example, there is known a method of selectively removing sacrificial layers from a stack including the sacrificial layers and the insulating layers 51, and filling the thus produced cavities with metal such as tungsten. Such sacrificial layers correspond to the insulating layers 181a. Thus, the stack 181 is formed substantially concurrently with the memory cell array 11 in the step of forming the memory cell array 11, up to the replacement of the sacrificial layers with the word lines WL.

Figure 6:
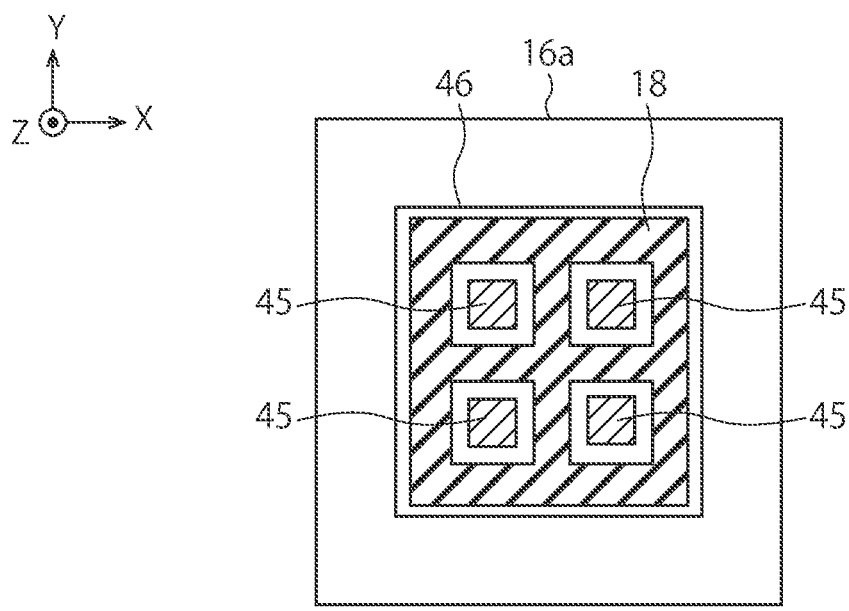
FIG. 6 is an overhead view illustrating the arrangement of a structural body and via plugs according to the first embodiment.

FIG. 6 is an overhead view illustrating the arrangement of the structural body 18 and the via plugs 45 according to the first embodiment. FIG. 6 is a view in which the opening 16a is seen in the Z-direction of FIG. 5. In the example illustrated in FIG. 6, two rows×two columns of via plugs 45 are arranged for a single metal pad 46.

As illustrated in FIG. 6, the structural body 18 is arranged so as not to be in contact with the via plugs 45. That is, the interlayer dielectric 13 is provided between the insulating layers 181a and 181b of the structural body 18 and the via plugs 45. The structural body 18 is formed such that it has openings around the via plugs 45, for example.

In addition, in the example illustrated in FIG. 6, the structural body 18 is formed within the range of the metal pads 46. However, the position of the structural body 18 is not limited thereto, and it may be provided outside the range of the metal pads 46. The structural body 18 is preferably arranged in as wide a region as possible from the perspective of strength, but the position of the structural body 18 may be changed depending on the arrangement of the other components in the array chip 1.

As illustrated in FIG. 5, the insulating layer 61 is provided in the opening 16a so as to allow the metal pads 46 to be at least partially exposed to the side of the face F4 of the substrate 16 in the region A1. The insulating layer 61 is a silicon oxide film, for example. The insulating layer 61 includes the face F1 and a face F2 on the side opposite thereto. In the example illustrated in FIG. 5, the face F1 is substantially parallel with the face F3, and the face F2 is substantially parallel with the face F4.

The insulating layer 62 is provided so as to cover the connected portion of the array chip 1 and the circuit chip 2 along the side faces thereof. In the example illustrated in FIG. 5, the metal pads 38 and 41 used for joining the array chip 1 and the circuit chip 2 together are exposed from the interlayer dielectrics 14 and 13, respectively. As the insulating layer 62 covers the metal pads 38 and 41, contamination of the metal pads 38 and 41 due to mixture of impurities and the like thereinto during the manufacturing process can be suppressed. The insulating layer 61 is a silicon oxide film, for example. More specifically, the material of the insulating layer 62 is the same as that of the insulating layer 61. This is because the insulating layers 61 and 62 are formed at a time as described later. It should be noted that in FIG. 5, the side faces of the array chip 1 and the circuit chip 2 provided with the insulating layer 62 correspond to the side faces of the outer peripheries of the wafers. Meanwhile, in FIG. 5, side faces on the side opposite to the side faces provided with the insulating layer 62 are a given continuous cross-section.

Next, a method of manufacturing the semiconductor device will be described.

FIGS. 7 to 14 are cross-sectional views illustrating a method of manufacturing the semiconductor device according to the first embodiment.

Figure 7:
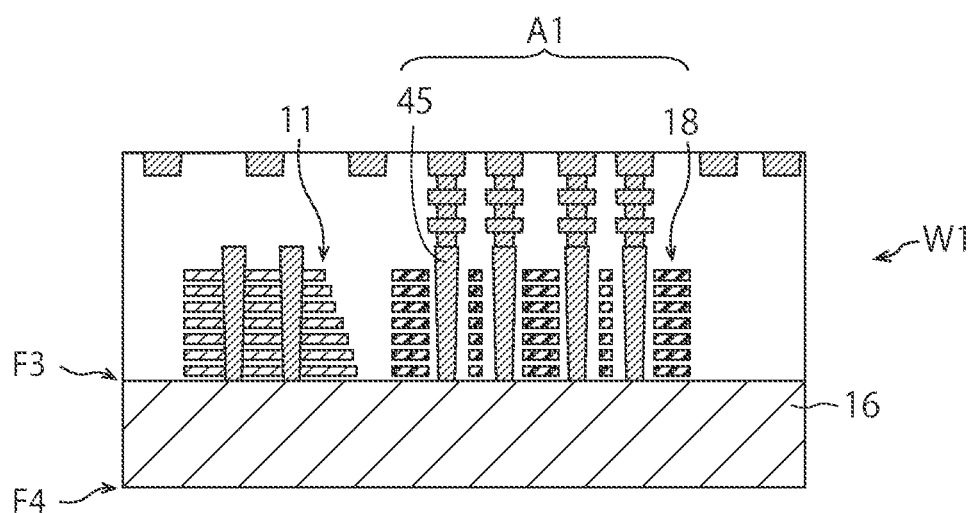
FIG. 7 is a cross-sectional view illustrating a method of manufacturing the semiconductor device according to the first embodiment.

First, as illustrated in FIG. 7, the memory cell array 11 and the via plugs 45 are formed on the face F3 of the substrate 16 that includes the face F3 and the face F4 on the side opposite thereto. Also, the structural body 18 is formed on the face F3 in the region A1. It should be noted that the orientation of the array wafer W1 in FIG. 7 is opposite to that of the array chip 1 in FIG. 5. More specifically, the structural body 18 is formed concurrently with the memory cell array 11 as described above.

In addition, as described with reference to FIG. 3, the transistors 31, wires, and the like are formed on the substrate 15.

Figure 8:
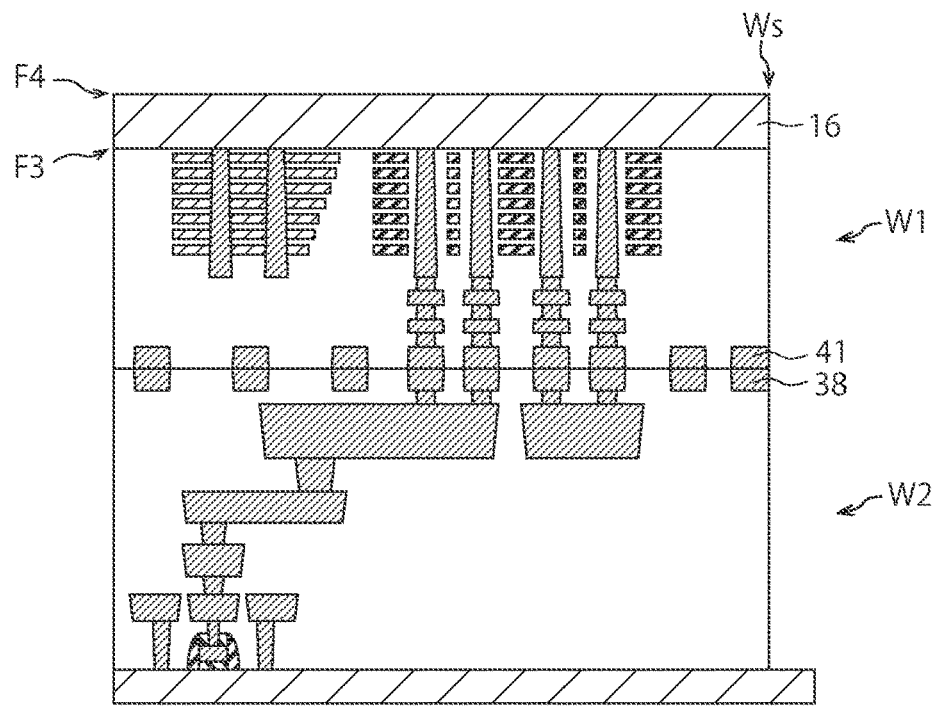
FIG. 8 is a cross-sectional view illustrating the method of manufacturing the semiconductor device, continued from FIG. 7.

Next, as illustrated in FIG. 8, the array wafer W1 and the circuit wafer W2 are bonded together. That is, the array wafer W1 having the substrate 16 and the circuit wafer W2 having formed therein the control circuit for controlling the memory cell array 11 are joined together. In addition, the substrate 16 is ground by back grinding. Further, the side faces Ws of the array wafer W1 and the circuit wafer W2 are polished by trimming, for example. The side faces Ws represent the side faces of the outer peripheries of the wafers. In the example illustrated in FIG. 8, polishing the side faces Ws results in exposing the metal pads 38 and 41 at the joint interface.

Figure 9:
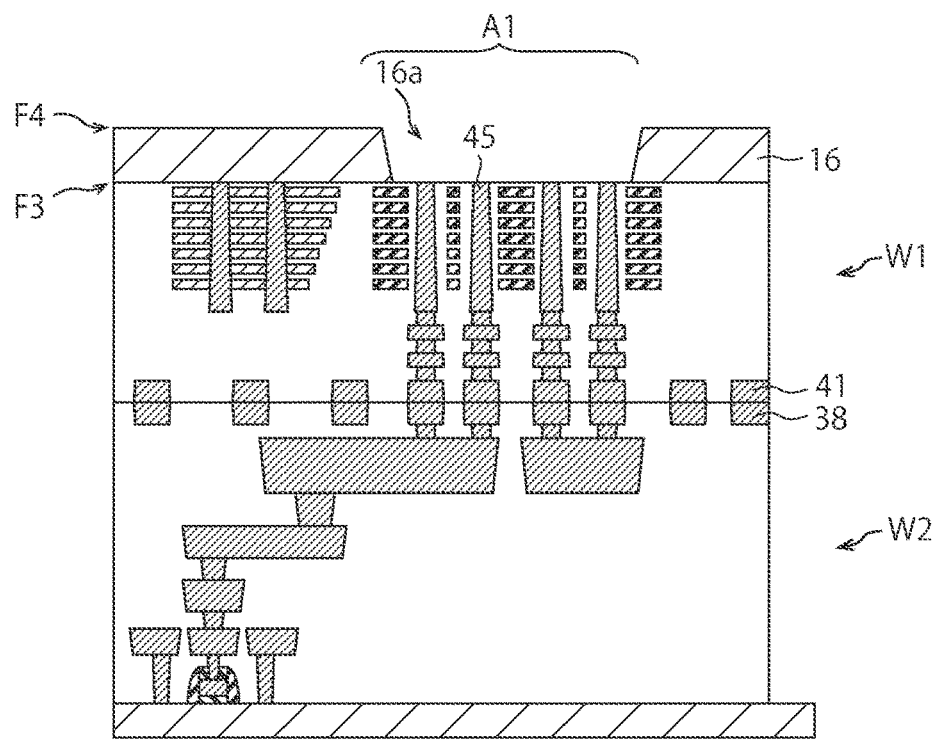
FIG. 9 is a cross-sectional view illustrating the method of manufacturing the semiconductor device, continued from FIG. 8.

Next, as illustrated in FIG. 9, the opening 16a extending from the face F4 to the face F3 of the substrate 16 in the region A1 is formed. For example, the opening 16a is formed by forming a silicon oxide film on the face F4 of the substrate 16 and applying an RIE (Reactive Ion Etching) process thereto using a resist mask. The via plugs 45 are exposed from the interlayer dielectric 13 at the bottom of the opening 16a.

Figure 10:
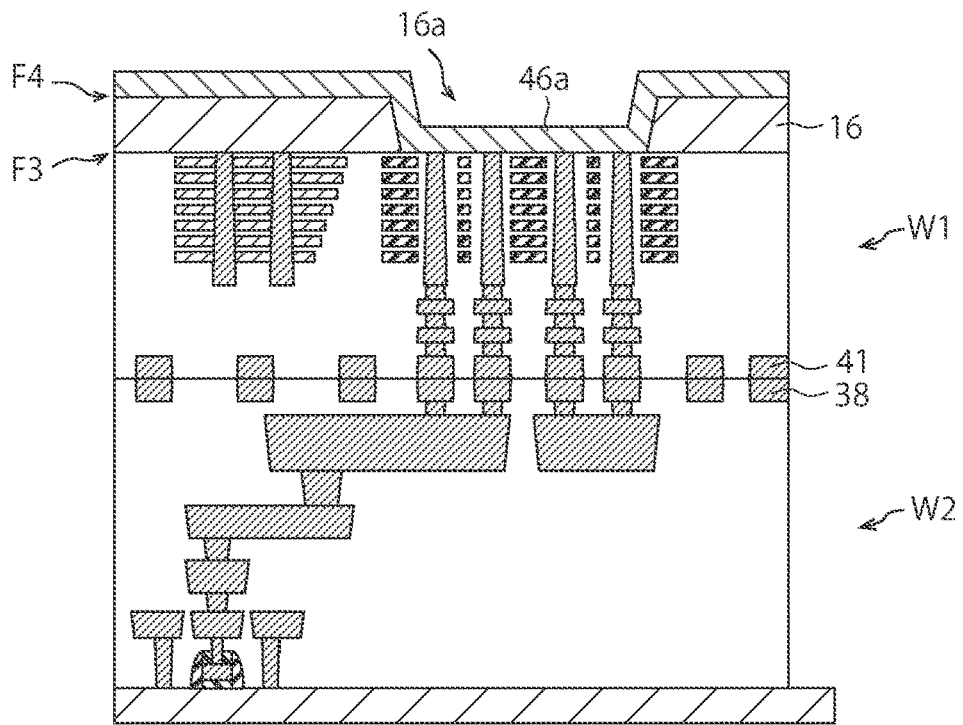
FIG. 10 is a cross-sectional view illustrating the method of manufacturing the semiconductor device, continued from FIG. 9.

Next, as illustrated in FIG. 10, an aluminum film 46a is formed on the face F4 and in the opening 16a. The aluminum film 46a is formed along the bottom of the opening 16a as well as the side faces and the face F4 of the substrate 16.

Figure 11:
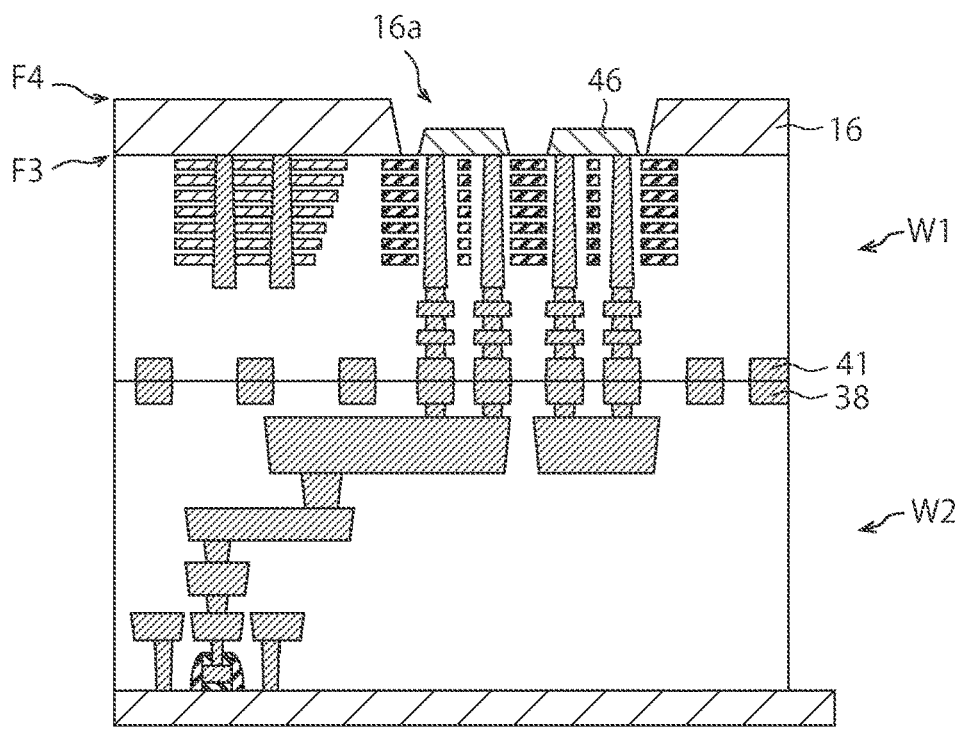
FIG. 11 is a cross-sectional view illustrating the method of manufacturing the semiconductor device, continued from FIG. 10.

Next, as illustrated in FIG. 11, the aluminum film 46a is etched with a resist mask, thereby forming in the opening 16a the metal pads 46 that are electrically connected to the via plugs 45.

Figure 12:
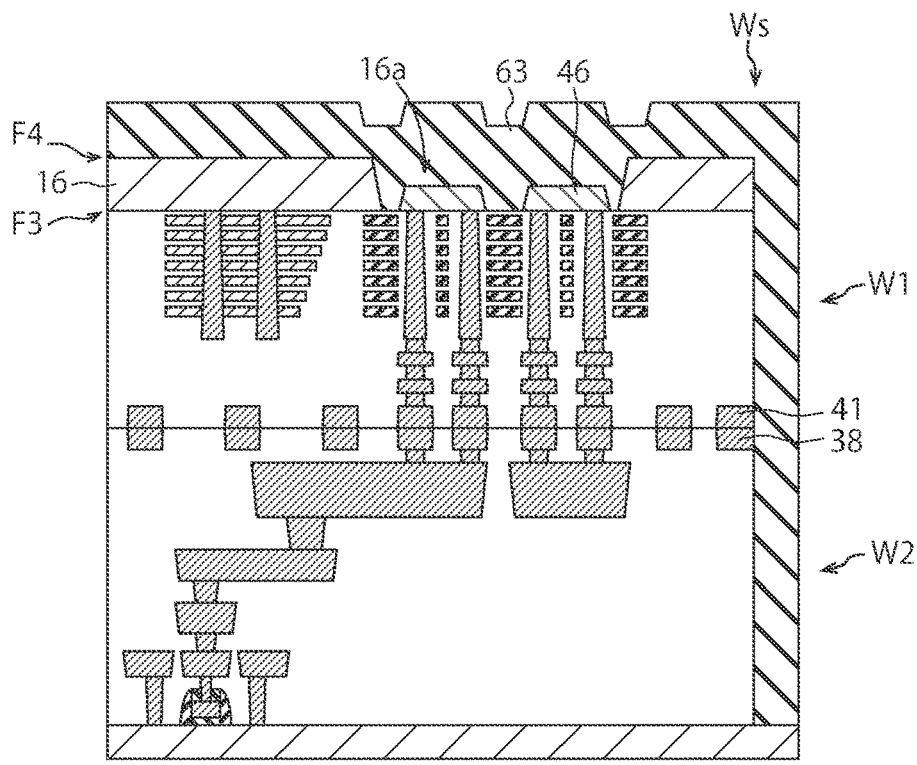
FIG. 12 is a cross-sectional view illustrating the method of manufacturing the semiconductor device, continued from FIG. 11.

Next, as illustrated in FIG. 12, an insulating layer 63 is formed covering the face F4 of the substrate 16, the opening 16a, the metal pads 46, and the side faces Ws. This allows the insulating layer 63 to substantially concurrently cover the metal pads 38 and 41 at the joint interface exposed from the side faces Ws and the upper and side faces of the substrate 16. The insulating layer 63 is a silicon oxide film, for example. The insulating layer 63 is formed using TEOS (Tetra-ethoxy silane), for example.

Figure 13:
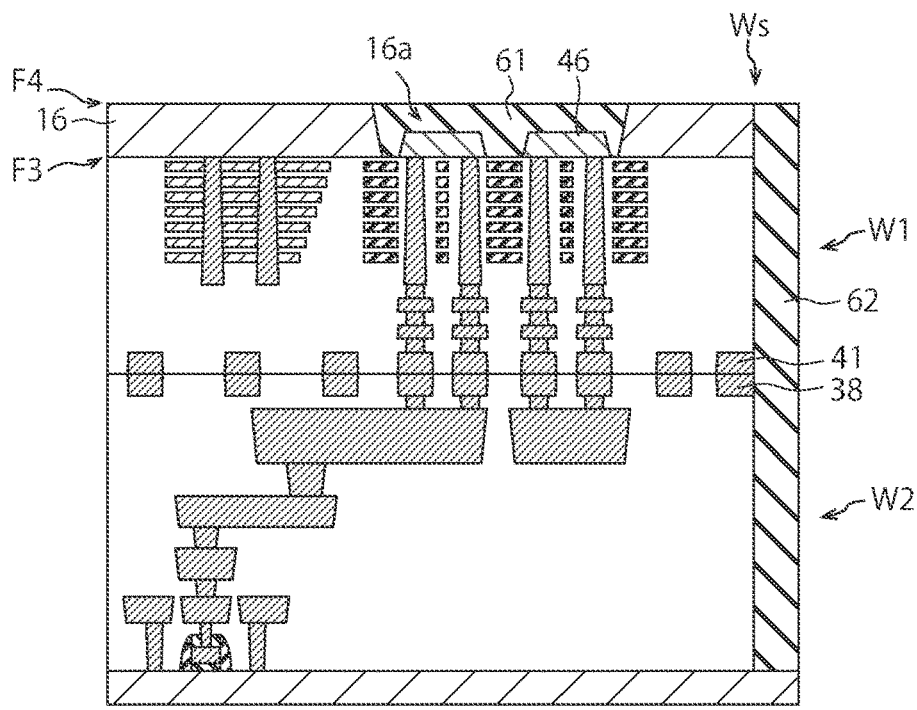
FIG. 13 is a cross-sectional view illustrating the method of manufacturing the semiconductor device, continued from FIG. 12.

Next, as illustrated in FIG. 13, the upper face of the insulating layer 63 is polished by CMP until the face F4 of the substrate 16 is exposed. Accordingly, the insulating layer 63 is separated into the insulating layer 61 and the insulating layer 62. That is, the insulating layer 61 to be provided in the opening 16a and the insulating layer 62 to be provided on the side faces Ws are formed concurrently. The insulating layer 62 is provided so as to cover the connected portion of the array wafer W1 and the circuit wafer W2 along the side faces Ws thereof. That is, the metal pads 38 and 41 remain covered with the insulating layer 62 after the polishing of CMP.

Figure 14:
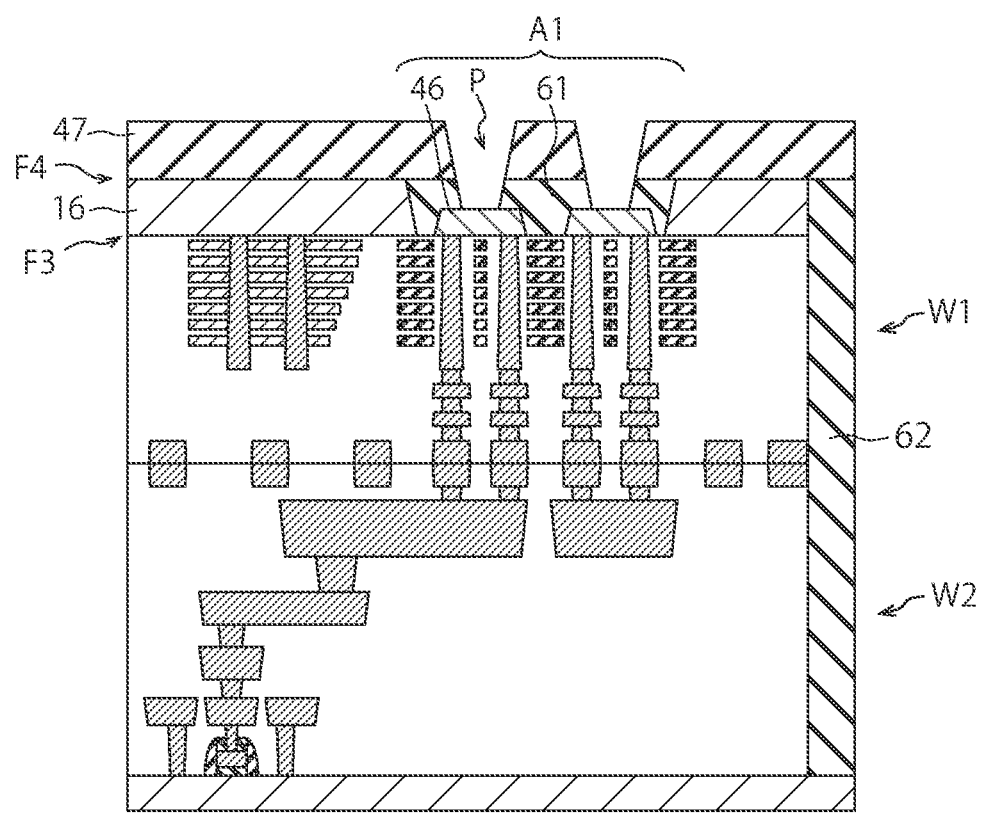
FIG. 14 is a cross-sectional view illustrating the method of manufacturing the semiconductor device, continued from FIG. 13.

Next, as illustrated in FIG. 14, the passivation film 47 is formed on the face F4 and the upper face (i.e., the face F2) of the insulating layer 61. For example, thick resist, such as PI (Polyimide), is applied, and then, exposure, development, and RIE process are performed thereon. Accordingly, the opening P for exposing the metal pads 46 can be formed. After that, the thus obtained bonded wafers are cut into individual pieces, so that the semiconductor device of FIG. 5 is completed.

As described above, according to the first embodiment, the metal pads 46 are provided in the opening 16a of the substrate 16 in the region A1 where wire bonding is to be performed. In addition, the structural body 18 is provided between the face F1 of the insulating layer 61 and the bonded face S in the region A1. The structural body 18 has a high strength, and thus can suppress the influence of mechanical stress that would be applied to the semiconductor device during wire bonding. Accordingly, even when wire bonding is performed on the metal pads 46 immediately above the via plugs 45, the influence of mechanical stress to be applied to the via plugs 45 and the like can be suppressed. Further, since stress to be applied during wire bonding need not be considered, design flexibility of the semiconductor elements, wires, and the like can be improved. It should be noted that after the wire bonding, the opening P and the bonded wires may be covered with a protective film of polyimide or resin, for example.

The structural body 18 is formed substantially concurrently with the memory cell array 11 in the step of forming the memory cell array 11. This can suppress an increase in the number of steps for forming the structural body 18. It should be noted that the structural body 18 need not necessarily be formed by using the step of forming the memory cell array 11. For example, the stack 181 may be formed as a robust stack, separately from the memory cell array 11.

Figure 15:
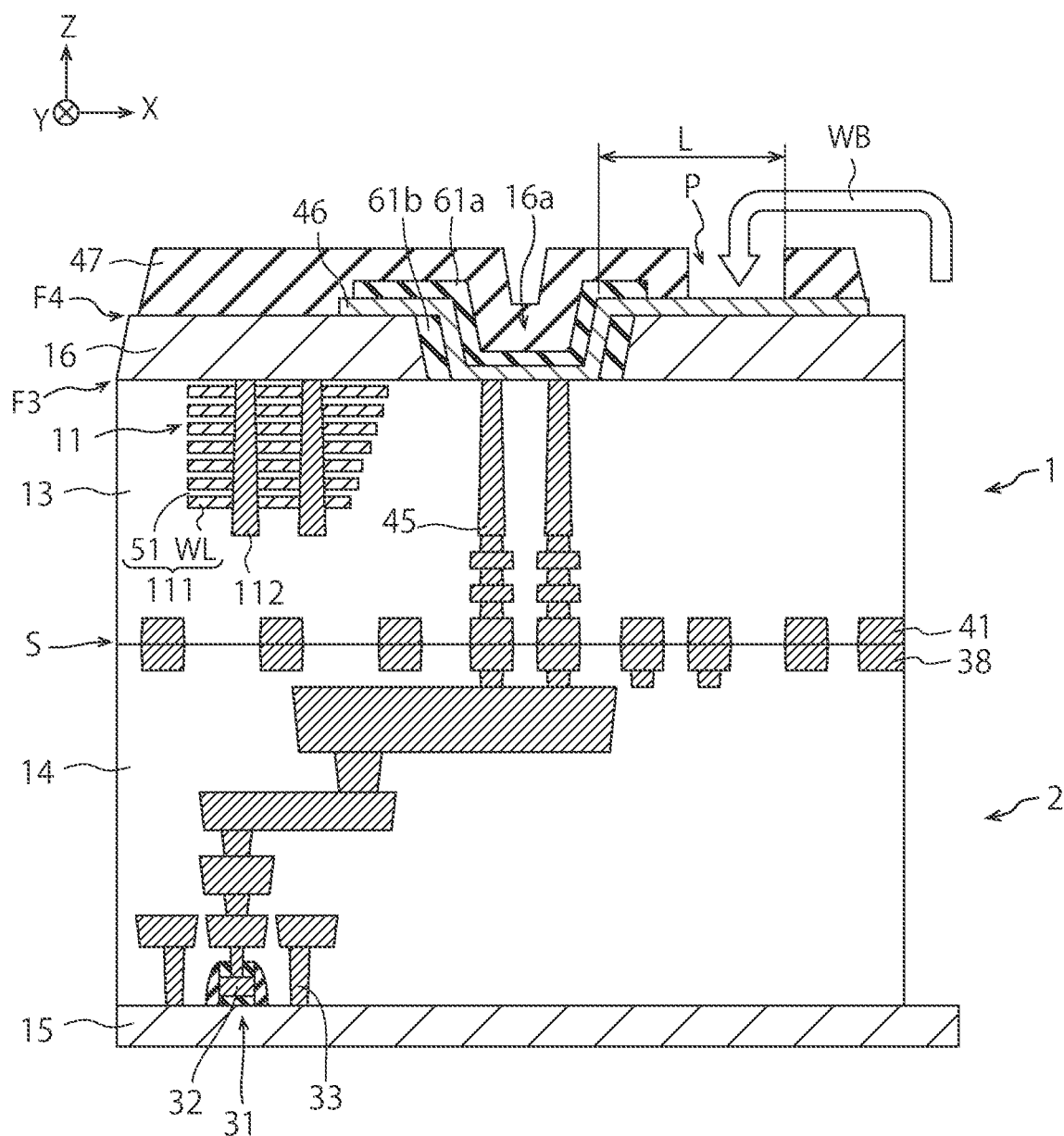
FIG. 15 is a cross-sectional view illustrating the configuration of a semiconductor device according to a comparative example.

FIG. 15 is a cross-sectional view illustrating the configuration of a semiconductor device according to a comparative example.

As a method for suppressing the influence of stress that would be applied when the structural body 18 is not provided, arranging the metal pad 46 such that it is drawn in the lateral direction (i.e., the horizontal direction) of FIG. 15 as illustrated in FIG. 15 is considered. In such a case, wire bonding WB is performed in the opening P that is located away from the opening 16a immediately above the via plugs 45. However, such a configuration needs a distance L from the opening 16a to the opening P to be secured. That is, an extra arrangement space for drawing the metal pad 46 is needed, which in turn hinders a reduction in the chip size.

In contrast, in the first embodiment, wires can be directly formed in the opening P in the region A1 by wire bonding WB without the metal pads 46 drawn in the lateral direction. Consequently, the chip area can be suppressed.

In addition, in the comparative example illustrated in FIG. 15, the metal pad 46 around the side walls of the opening 16a is formed at a high aspect ratio. Thus, there is a possibility that breaking (i.e., disconnection around the steps) of the metal pad 46 may occur at the edges of the opening 16a, which can result in a connection failure. Further, to draw the metal pad 46, it is necessary to form a multilayer film of the metal pad 46 and insulating layers 61a and 61b, for example, corresponding to the steps of the substrate 16, which in turn makes the manufacturing process complex. It should be noted that the insulating layers 61a and 61b are silicon oxide films, for example. In addition, in the structure illustrated in FIG. 15, it is difficult to form the insulating layer 62 as a protective film on the side faces of the chips in terms of the manufacturing process.

In contrast, in the first embodiment, the metal pads 46 can be formed along the face F1 (i.e., a flat face) in the opening 16a. The metal pads 46, which need not be drawn laterally, are provided between the face F1 and the face F2 (or between the face F3 and the face F4). Such a configuration can suppress disconnection of the metal pads 46 around the steps due to a high aspect ratio. In addition, the insulating layer 61 is provided in a region from the face F1 to the face F2 in the opening 16a. That is, the lower face (i.e., the face F1) and the upper face (i.e., the face F2) of the insulating layer 61 are flush with the face F3 and the face F4 of the substrate 16, respectively. Thus, the metal pads 46 and the insulating layer 61 can be formed more easily without the use of a complex multilayer film. Further, since the insulating layers 61 and 62 can be formed at a time, only one formation step is required (i.e., the insulating layers 61 and 62 can be formed in a common step). Consequently, the insulating layer 62 can be formed more easily.

Second Embodiment

Figure 16:
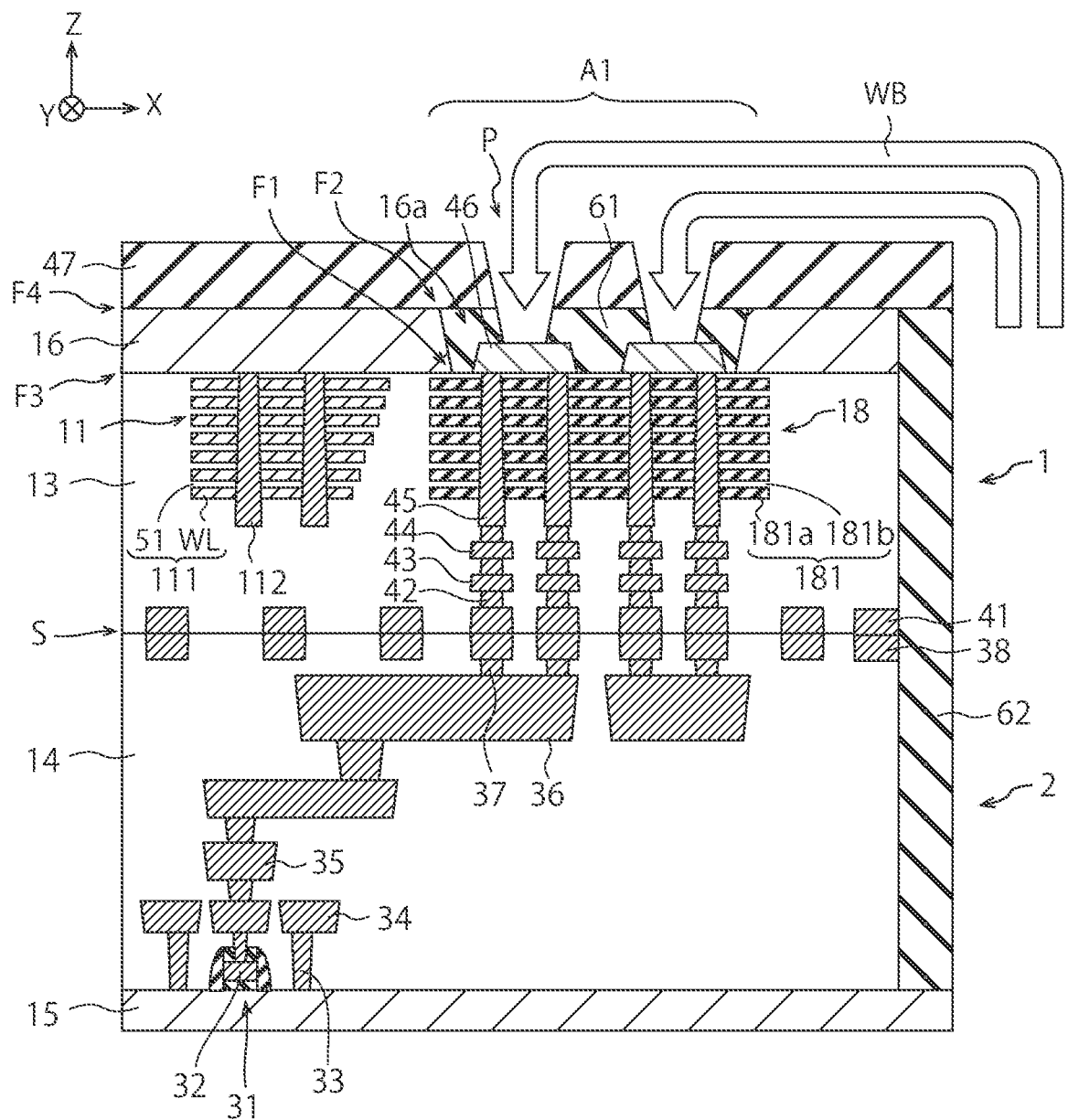
FIG. 16 is a cross-sectional view illustrating the configuration of a semiconductor device according to a second embodiment.

FIG. 16 is a cross-sectional view illustrating the configuration of a semiconductor device according to a second embodiment. The second embodiment differs from the first embodiment in that the structural body 18 is arranged so as to be in contact with the via plugs 45.

In the example illustrated in FIG. 16, the structural body 18 is provided continuously across the region A1 in contrast to the configuration illustrated in FIG. 5 of the first embodiment. In addition, the via plugs 45 are provided penetrating the structural body 18.

Figure 17:
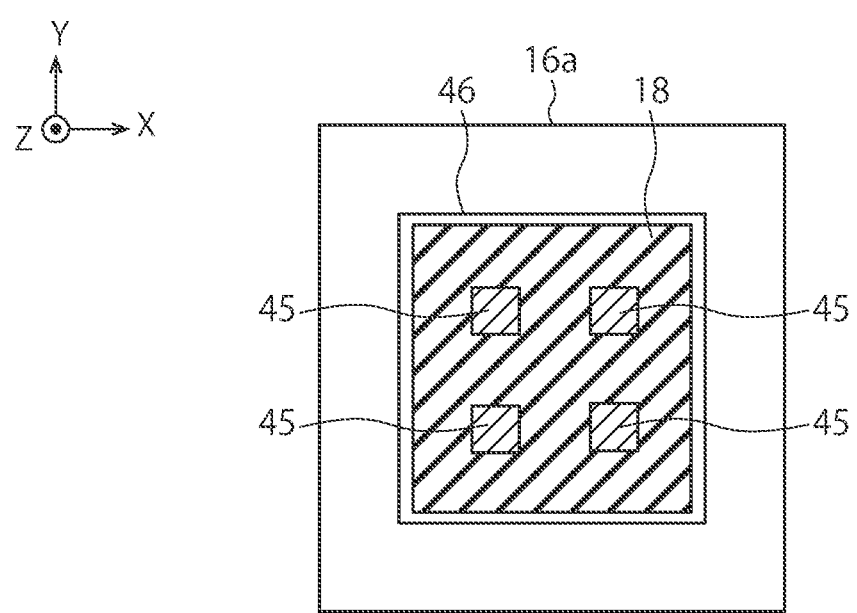
FIG. 17 is an overhead view illustrating the arrangement of a structural body and via plugs according to the second embodiment.

FIG. 17 is an overhead view illustrating the arrangement of the structural body 18 and the via plugs 45 according to the second embodiment.

As illustrated in FIG. 17, the stack 181 is provided so as to be in contact with the via plugs 45. The insulating layers 181a and 182b are insulators. Thus, even when the insulating layers 181a and 182b contact the via plugs 45, short circuit between the via plugs 45 does not occur. Therefore, there is no influence on the operation of the control circuit including the transistors 31. In addition, since the area for arrangement of the structural body 18 can be secured large, the robustness of the structural body 18 can be improved. Further, since the structural body 18 can directly support the via plugs 45, the influence of stress that would be applied to the via plugs 45 can be suppressed more. Consequently, the influence of stress that would be applied during wire bonding can be suppressed more.

In the second embodiment, openings of the structural body 18 around the via plugs 45, such as those illustrated in FIG. 6 of the first embodiment, are not provided. Thus, the stack 181 can be formed substantially uniformly as with the stack 111 of the memory cell array 11. Consequently, the structural body 18 can be formed more easily than in the first embodiment.

The other configurations of the semiconductor device according to the second embodiment are similar to the corresponding configurations of the semiconductor device according to the first embodiment. Thus, the detailed descriptions thereof are omitted herein. The semiconductor device according to the second embodiment can obtain similar advantageous effects to those of the first embodiment.

Third Embodiment

Figure 18:
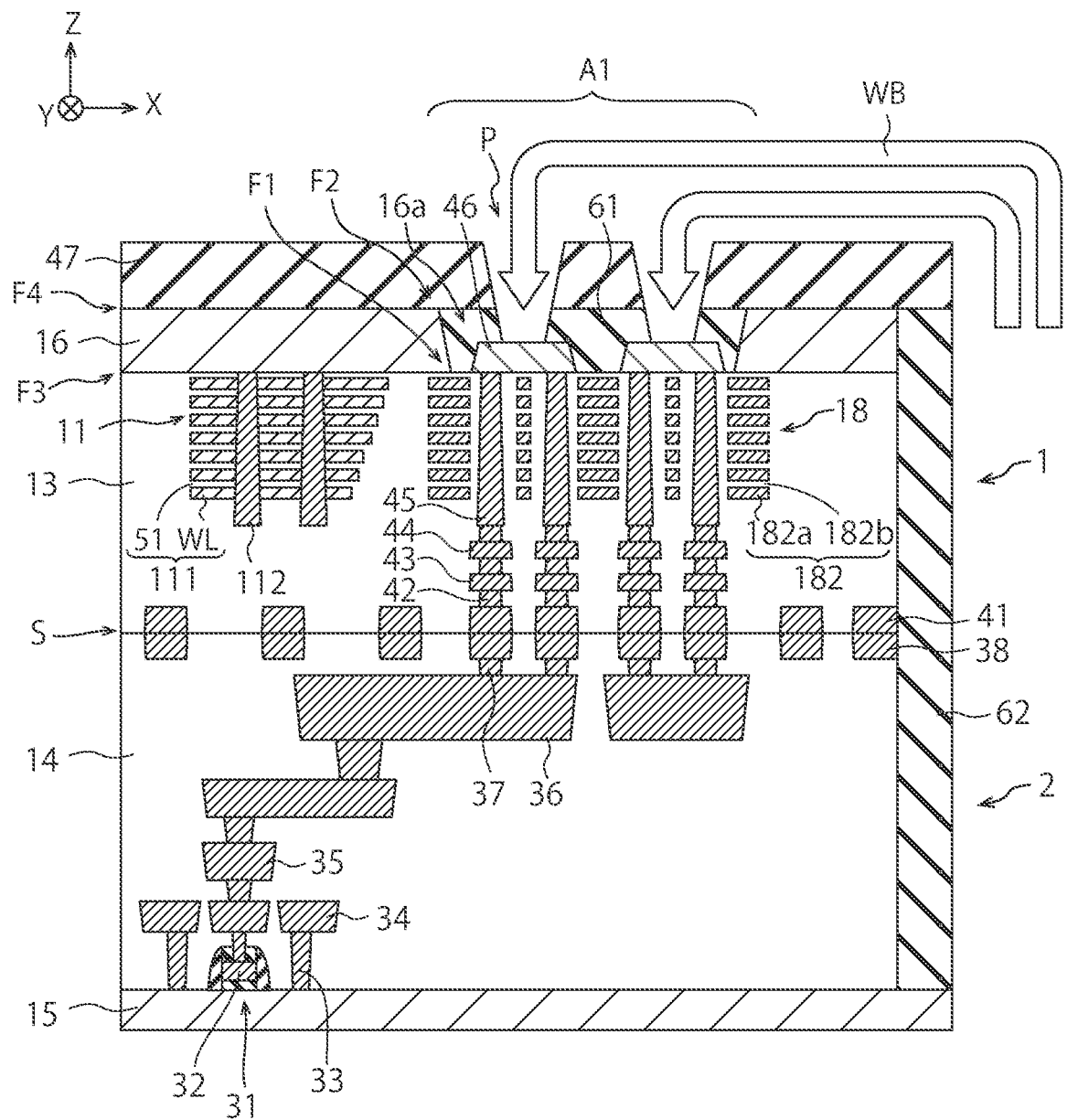
FIG. 18 is a cross-sectional view illustrating the configuration of a semiconductor device according to a third embodiment.

FIG. 18 is a cross-sectional view illustrating the configuration of a semiconductor device according to a third embodiment. The third embodiment differs from the first embodiment in that the stack of the structural body 18 includes metal layers.

The structural body 18 has a stack 182 including a plurality of metal layers 182a and a plurality of insulating layers 182b that are alternately stacked corresponding to the stack 111 and are electrically disconnected from the via plugs 45. This is because the structural body 18 (or the stack 182) is formed substantially concurrently with the memory cell array 11 in the step of forming the memory cell array 11. Thus, each metal layer 182a has substantially the same position with respect to the face F1 as well as the same thickness as each word line WL. In addition, each insulating layer 182b has substantially the same position with respect to the face F1 as well as the same thickness as each insulating layer 51.

The material of each metal layer 182a is the same as that of each word line WL of the stack 111, such as tungsten, for example. Tungsten of the metal layer 182a has a higher strength than silicon oxide of the interlayer dielectric 13. Accordingly, the structural body 18 has a high strength. In addition, the material of each insulating layer 182b is the same as that of each insulating layer 51 of the stack 111. The insulating layer 182b is a silicon oxide film, for example.

In the third embodiment, each insulating layer 181a, which is a sacrificial layer, in the first embodiment is replaced with the metal layer 182a. Thus, the stack 182 is formed substantially concurrently with the memory cell array 11 in the steps of forming the memory cell array 11 including the replacement step.

Figure 19:
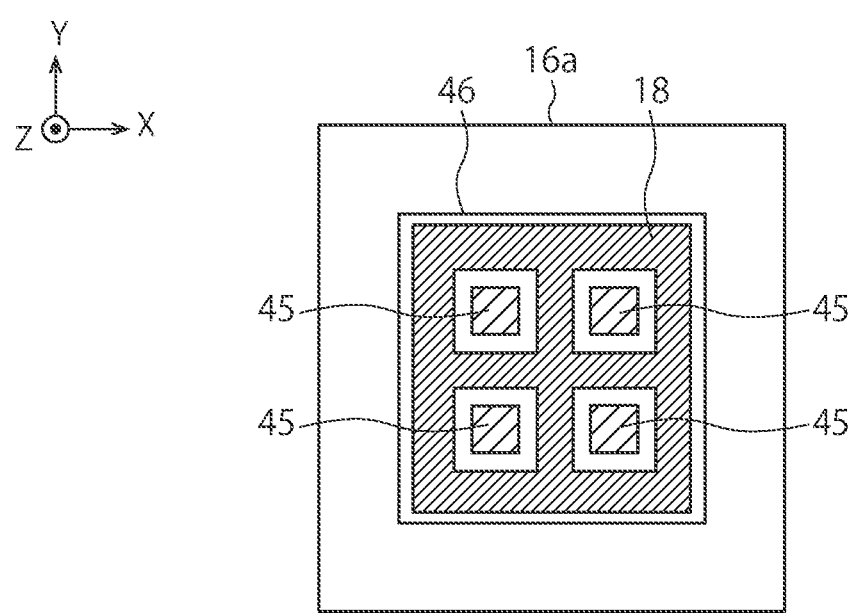
FIG. 19 is an overhead view illustrating the arrangement of a structural body and via plugs according to the third embodiment.

FIG. 19 is an overhead view illustrating the arrangement of the structural body 18 and the via plugs 45 according to the third embodiment.

As illustrated in FIG. 19, the structural body 18 is arranged so as not to be in contact with the via plugs 45. That is, the interlayer dielectric 13 is provided between the metal layers 182a of the structural body 18 and the via plugs 45. Accordingly, short circuit between the via plugs 45 can be suppressed. The metal layers 182a are in an electrically floating state, for example. The structural body 18 is formed such that it has openings around the via plugs 45, for example.

The other configurations of the semiconductor device according to the third embodiment are similar to the corresponding configurations of the semiconductor device according to the first embodiment. Thus, the detailed descriptions thereof are omitted herein. The semiconductor device according to the third embodiment can obtain similar advantageous effects to those of the first embodiment.

Fourth Embodiment

Figure 20:
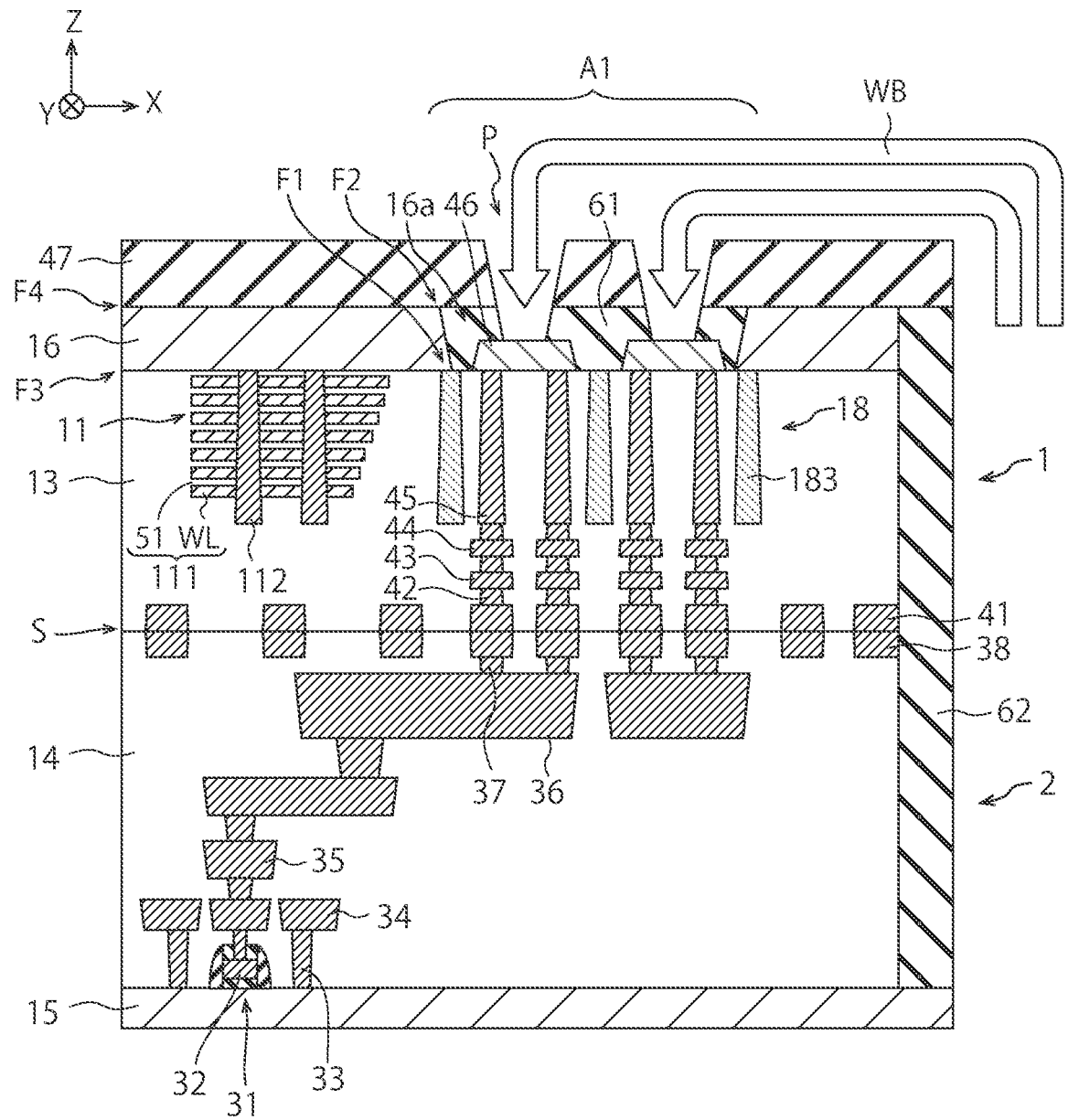
FIG. 20 is a cross-sectional view illustrating the configuration of a semiconductor device according to a fourth embodiment.

FIG. 20 is a cross-sectional view illustrating the configuration of a semiconductor device according to a fourth embodiment. The fourth embodiment differs from the first embodiment in that the structural body 18 is not a stack.

In the example illustrated in FIG. 20, the structural body 18 includes columnar portions 183 provided corresponding to the columnar portions 112 of the memory cell array 11. The memory cell array 11 includes the columnar portions 112 that are provided along the Z-direction so as to be connected to the stack 111. The columnar portions 112 are the contact plugs 22 illustrated in FIG. 1, for example. However, the columnar portions 112 are not limited thereto and may be other contact plugs in the memory cell array 11. The structural body 18 includes a plurality of columnar portions 183 provided along the Z-direction. That is, the columnar portions 183 are provided so as to be substantially in parallel with the columnar portions 112. As illustrated in FIG. 20, the columnar portions 183 are not connected to the wire layer 44 unlike the via plugs 45. Thus, the columnar portions 183 are in an electrically floating state.

It should be noted that the columnar portions 183 are not limited to metal and may be insulators. In such a case, the material of the columnar portions 112 formed substantially concurrently with the columnar portions 183 may be the same material of the columnar portions CL illustrated in FIG. 1 or of columnar portions provided to support the stepped structure portion 21 in the replacement step, for example. It should also be noted that the structural body 18 need not necessarily be formed by using the step of forming the memory cell array 11. For example, the columnar portions 183 may be formed as robust columnar portions, separately from the memory cell array 11.

The other configurations of the semiconductor device according to the fourth embodiment are similar to the corresponding configurations of the semiconductor device according to the first embodiment. Thus, the detailed descriptions thereof are omitted herein. The semiconductor device according to the fourth embodiment can obtain similar advantageous effects to those of the first embodiment. In addition, the semiconductor device according to the fourth embodiment may be combined with any of the semiconductor devices according to the first to third embodiments. In such a case, the structural body 18 may include both the stacks 181 and 182 and the columnar portions 183.

Fifth Embodiment

Figure 21:
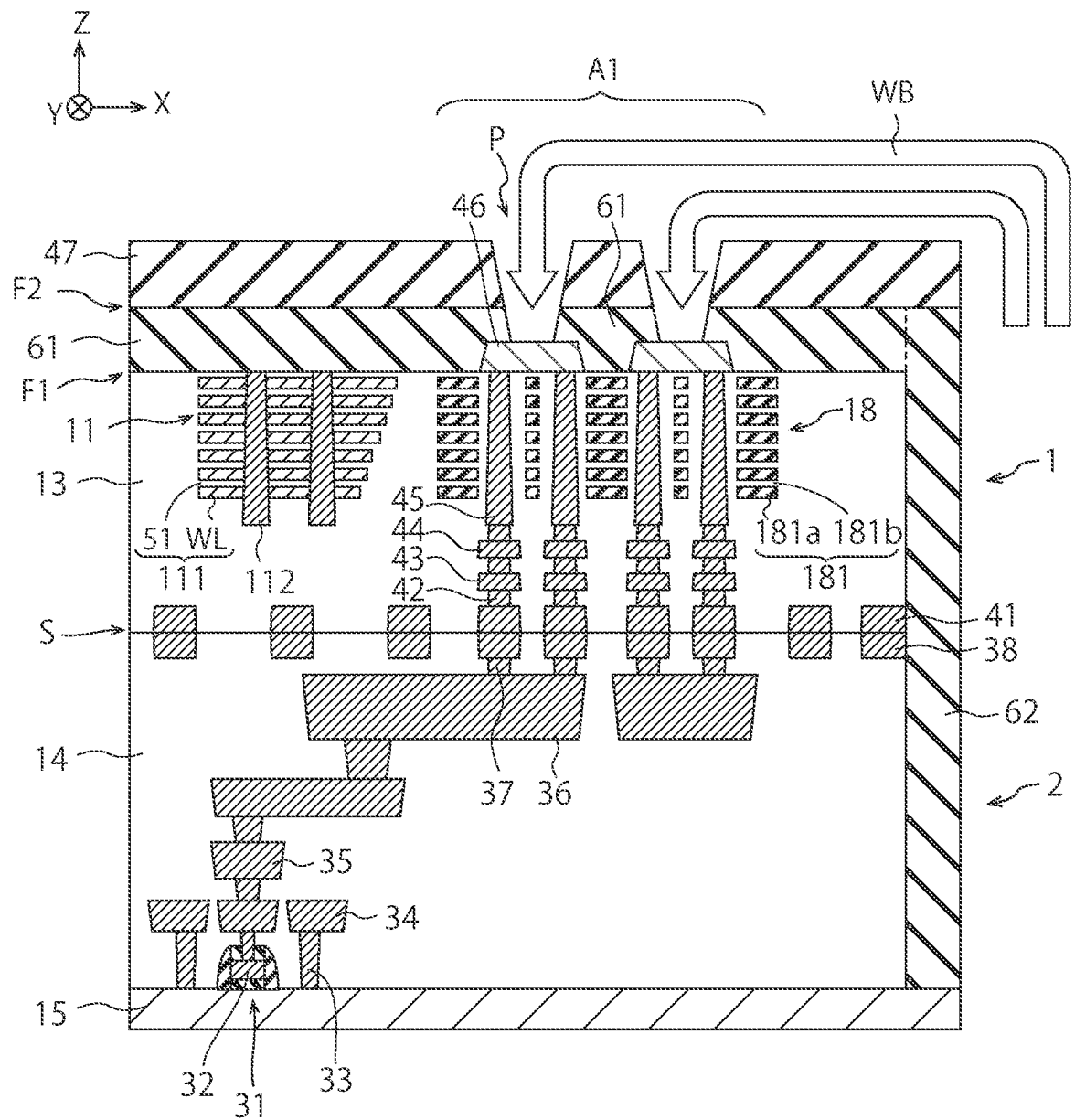
FIG. 21 is a cross-sectional view illustrating the configuration of a semiconductor device according to a fifth embodiment.

FIG. 21 is a cross-sectional view illustrating the configuration of a semiconductor device according to a fifth embodiment. As illustrated in FIG. 21, the array chip 1 has a pad opening P in an insulating layer provided on the interlayer dielectric 13 unlike in the first embodiment, and the pads 46 are provided on the interlayer dielectric 13.

In FIG. 21, the substrate 16 illustrated in FIG. 5 has been completely removed in contrast to the configuration illustrated in FIG. 5. In addition, in FIG. 21, the insulating layer 61 covers the upper face of the interlayer dielectric 13.

As illustrated in FIG. 21, the array chip 1 includes the metal pads 46, the via plugs 45, the structural body 18, and the insulating layers 61 and 62.

The insulating layer 61 is arranged on the side opposite to the face S bonded (joined) to the circuit chip 2. The insulating layer 61 includes a face F1 and a face F2 on the side opposite thereto. The face F1 is a face that is opposite the bonded face S, and the memory cell array 11 is provided between the face F1 and the bonded face S. In addition, the insulating layer 61 further includes the pad opening P extending from the face F2 to the face F1 in a region A1. The region A1 is a region where wires are to be formed by wire bonding WB as described later.

The metal pads 46 are provided in the pad opening P. The metal pads 46 are electrically connected to bonding wires by wire bonding WB in the region A1. In the example illustrated in FIG. 21, two metal pads 46 are provided. However, the number of metal pads 46 is not limited thereto. The material of the metal pads 46 is aluminum (Al), for example.

The via plugs 45 are provided between the face F1 and the bonded face S and are electrically connected to the metal pads 46. In addition, as illustrated in FIG. 21, the via plugs 45 are also connected to the transistors 31 partially forming the control circuit. That is, the via plugs 45 are electrically connected to the control circuit provided in the circuit chip 2. The via plugs 45 are formed substantially concurrently with the columnar portions 112 (e.g., the contact plugs 22 in FIG. 1) of the memory cell array 11, for example. Thus, the material of the via plugs 45 is the same as that of the contact plugs 22, such as tungsten, for example. It should be noted that the shape of each via plug 45 is not limited to a column, and may be a structural body with other shapes. Such a structural body may include a wire layer connected to the via plug 45, for example.

The structural body 18 is provided between the face F1 and the bonded face S in the region A1.

As described above, a method of forming wires on the metal pads 46 by wire bonding WB is known as one of the methods for connecting the semiconductor device to an external substrate for mounting or to an external device, for example. When wire bonding WB is performed, a load is applied to the metal pads 46 for a given period of time with a bonding tool, such as a capillary, for example. Thus, stress would be applied to the semiconductor device during wire bonding. Herein, the metal pads 46 to be electrically connected to the transistors 31 are provided after the insulating layer 61 has been partially removed as illustrated in the region A1. Thus, there is a possibility that the strength of the region A1 may decrease. For example, there is a possibility that the memory cell array 11, the transistors 31, the via plugs 45, the wire layers, or the like arranged immediately below or around the pad opening P may become mechanically damaged due to stress.

Thus, in the fifth embodiment, the structural body 18, which functions as a stress countermeasure film during wire bonding, is provided immediately below the pad opening P. The structural body 18 has a highly stiff or robust structure, for example. Accordingly, load resistance and impact resistance can be improved. This can alleviate the influence of stress to be applied to the inside of the semiconductor device during wire bonding.

In the example illustrated in FIG. 21, the structural body 18 is a stack formed corresponding to the stack 111 of the memory cell array 11. As described with reference to FIG. 2, the memory cell array 11 has the stack 111 including a plurality of word lines WL (i.e., conductive layers) and a plurality of insulating layers 51 that are alternately stacked in the Z-direction perpendicular to the face F1. Thus, the structural body 18 has a stack 181 including two types of insulating layers: 181*a* and 181*b* that are alternately stacked corresponding to the stack 111. This is because the structural body 18 (or the stack 181) is formed substantially concurrently with the memory cell array 11 in the step of forming the memory cell array 11. Therefore, each insulating layer 181*a* has substantially the same position with respect to the face F1 as well as the same thickness as each word line WL. In addition, each insulating layer 181*b* has substantially the same position with respect to the face F1 as well as the same thickness as each insulating layer 51.

One of the two types of insulating layers: 181*a* and 181*b* of the stack 181 is the same as each insulating layer 51 of the stack 111. In the example illustrated in FIG. 21, each insulating layer 181*b* is a silicon oxide film, for example. Thus, the material of each insulating layer 181*b* is the same as that of each insulating layer 51. Meanwhile, each insulating layer 181*a* is a silicon nitride film, for example. Silicon nitride (SiN) has a higher strength than silicon oxide ($SiO_2$) of the interlayer dielectric 13. Accordingly, the structural body 18 has a high strength.

Herein, as a method for forming the stack 111 of the memory cell array 11, for example, there is known a method of selectively removing sacrificial layers from a stack including the sacrificial layers and the insulating layers 51, and filling the thus produced cavities with metal such as tungsten. Such sacrificial layers correspond to the insulating layers 181*a*. Thus, the stack 181 is formed substantially concurrently with the memory cell array 11 in the step of forming the memory cell array 11, up to the replacement of the sacrificial layers with the word lines WL.

As illustrated in FIG. 21, the insulating layer 61 is provided in the pad opening P so as to allow the metal pads 46 to be at least partially exposed to the side of the face F2 of the insulating layer 61 in the region A1. The insulating layer 61 is a silicon oxide film, for example.

The insulating layer 62 is provided so as to cover the connected portion of the array chip 1 and the circuit chip 2 along the side faces thereof. In the example illustrated in FIG. 21, the metal pads 38 and 41 used for joining the array chip 1 and the circuit chip 2 together are exposed from the interlayer dielectrics 14 and 13, respectively. As the insulating layer 62 covers the metal pads 38 and 41, contamination of the metal pads 38 and 41 due to mixture of impurities and the like thereinto during the manufacturing process can be suppressed. The insulating layer 61 is a silicon oxide film, for example. More specifically, the material of the insulating layer 62 is the same as that of the insulating layer 61. This is because the insulating layers 61 and 62 are formed at a time as described later. It should be noted that in FIG. 21, the two insulating layers 61 and 62 are divided by the dotted line. However, the insulating layers 61 and 62 are integrally formed in a single step as described later. It should also be noted that in FIG. 21, the side faces of the array chip 1 and the circuit chip 2 provided with the insulating layer 62 correspond to the side faces of the outer peripheries of the wafers. Meanwhile, in FIG. 21, side faces on the side opposite to the side faces provided with the insulating layer 62 are a given continuous cross-section.

Next, a method of manufacturing the semiconductor device according to the fifth embodiment will be described. FIGS. 22 to 27 are cross-sectional views illustrating a method of manufacturing the semiconductor device according to the fifth embodiment.

Figure 22:
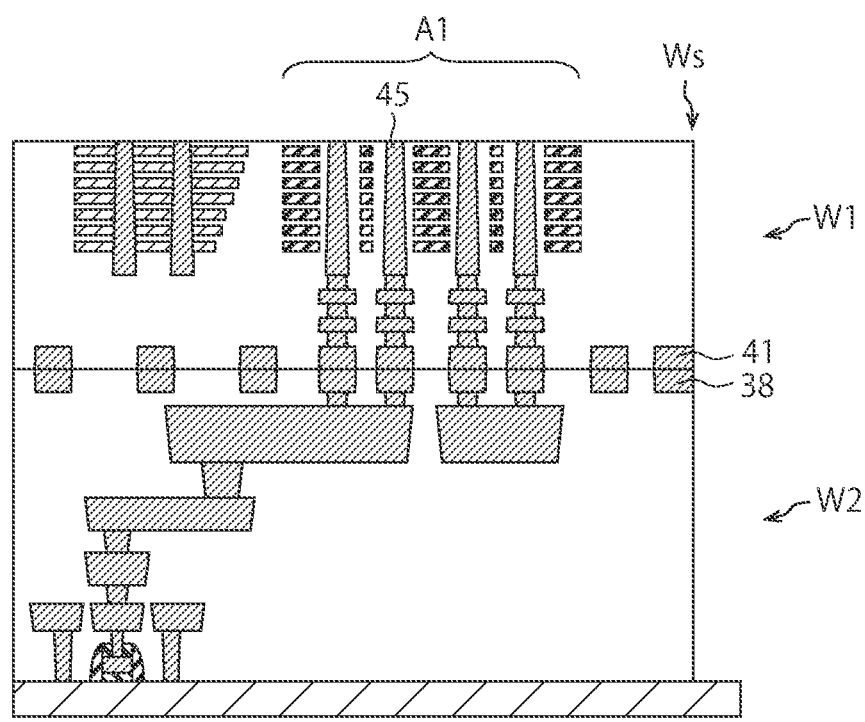
FIG. 22 is a cross-sectional view illustrating a method of manufacturing the semiconductor device according to the fifth embodiment.

The semiconductor device is produced in the same way as in the first embodiment up to FIG. 7. Next, as illustrated in FIG. 8, the array wafer W1 and the circuit wafer W2 are bonded together. That is, the array wafer W1 having the substrate 16 and the circuit wafer W2 having formed therein the control circuit for controlling the memory cell array 11 are joined together. In addition, as illustrated in FIG. 22, the substrate 16 is ground by back grinding until the interlayer dielectric 13 is exposed. The via plugs 45 are exposed on the upper surface of the interlayer dielectric 13. Further, the side faces Ws of the array wafer W1 and the circuit wafer W2 are polished by trimming, for example. The side faces Ws represent the side faces of the outer peripheries of the wafers. In the example illustrated in FIG. 22, polishing the side faces Ws results in exposing the metal pads 38 and 41 (i.e., the bond pads) at the joint interface.

Figure 23:
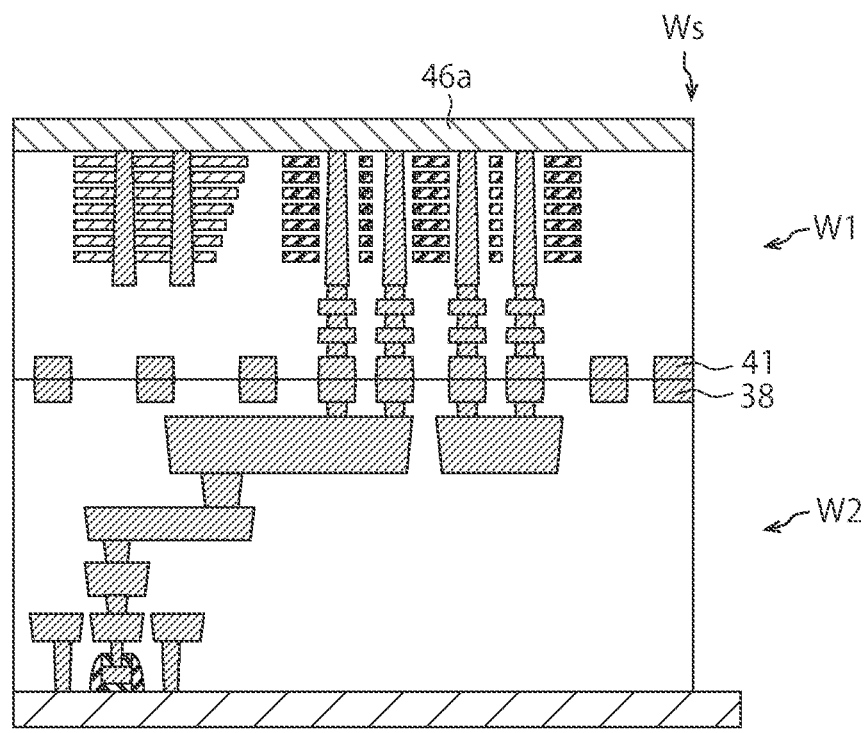
FIG. 23 is a cross-sectional view illustrating the method of manufacturing the semiconductor device, continued from FIG. 22.
Figure 24:
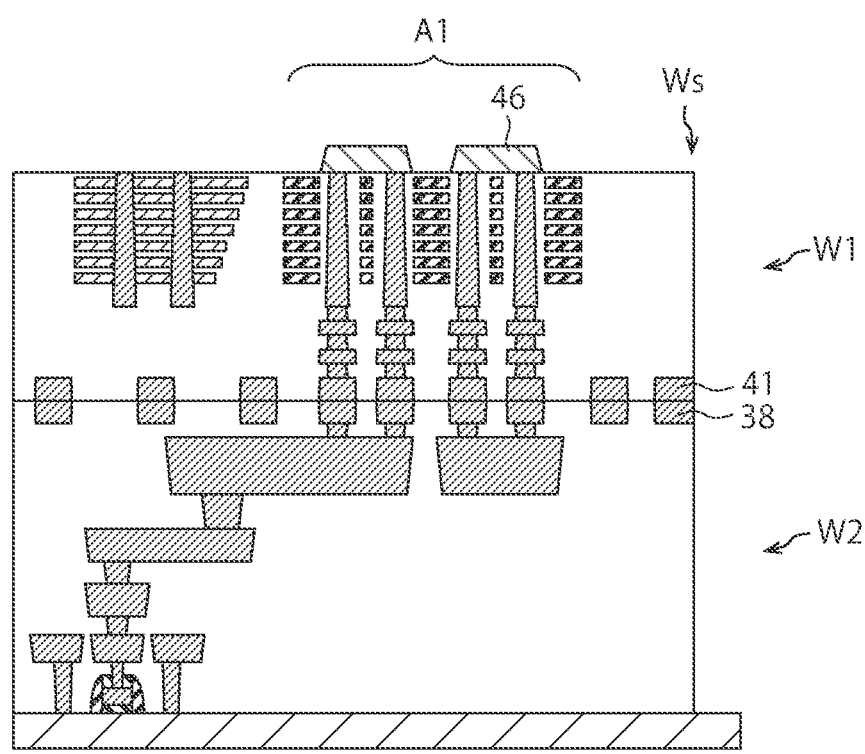
FIG. 24 is a cross-sectional view illustrating the method of manufacturing the semiconductor device, continued from FIG. 23.

Next, as illustrated in FIG. 23, an aluminum film 46a is formed on the interlayer dielectric 13. Next, as illustrated in FIG. 24, the aluminum film 46a is etched with a resist mask, thereby forming in the region A1 the metal pads 46 that are electrically connected to the via plugs 45.

Figure 25:
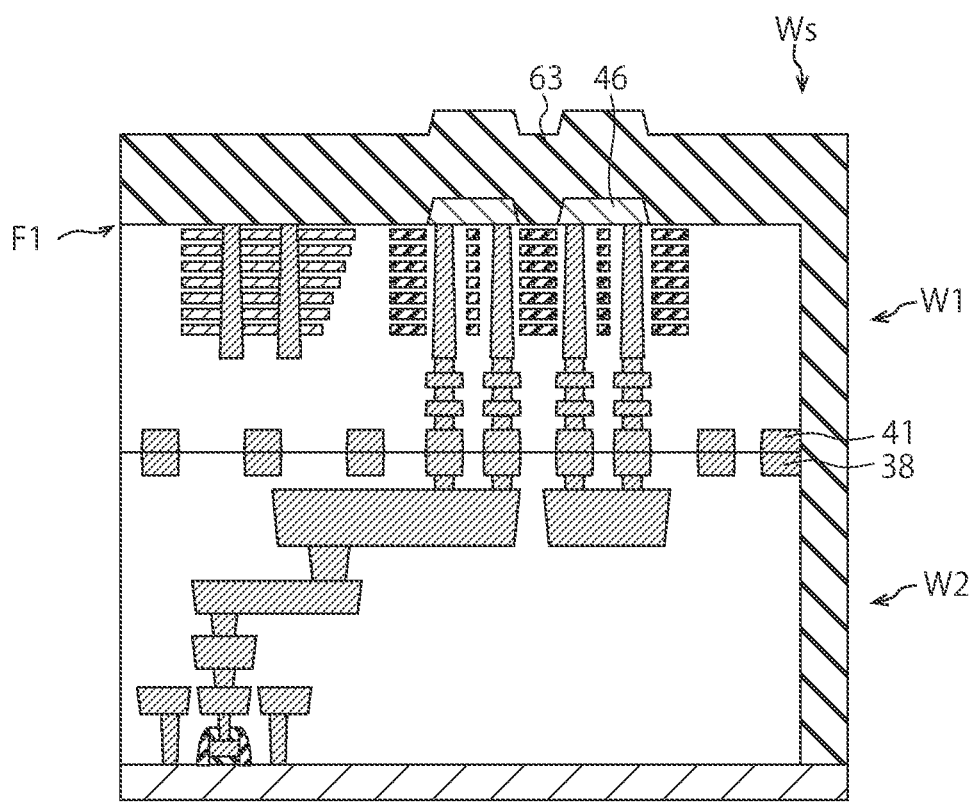
FIG. 25 is a cross-sectional view illustrating the method of manufacturing the semiconductor device, continued from FIG. 24.

Next, as illustrated in FIG. 25, an insulating layer 63 is formed covering the interlayer dielectric 13, the metal pads 46, and the side faces Ws. This allows the insulating layer 63 to substantially concurrently cover the metal pads 38 and 41 at the joint interface exposed from the side faces Ws and the upper and side faces of the interlayer dielectric 13. The insulating layer 63 is a silicon oxide film, for example. The insulating layer 63 is formed using TEOS (Tetra-ethoxy silane), for example.

Figure 26:
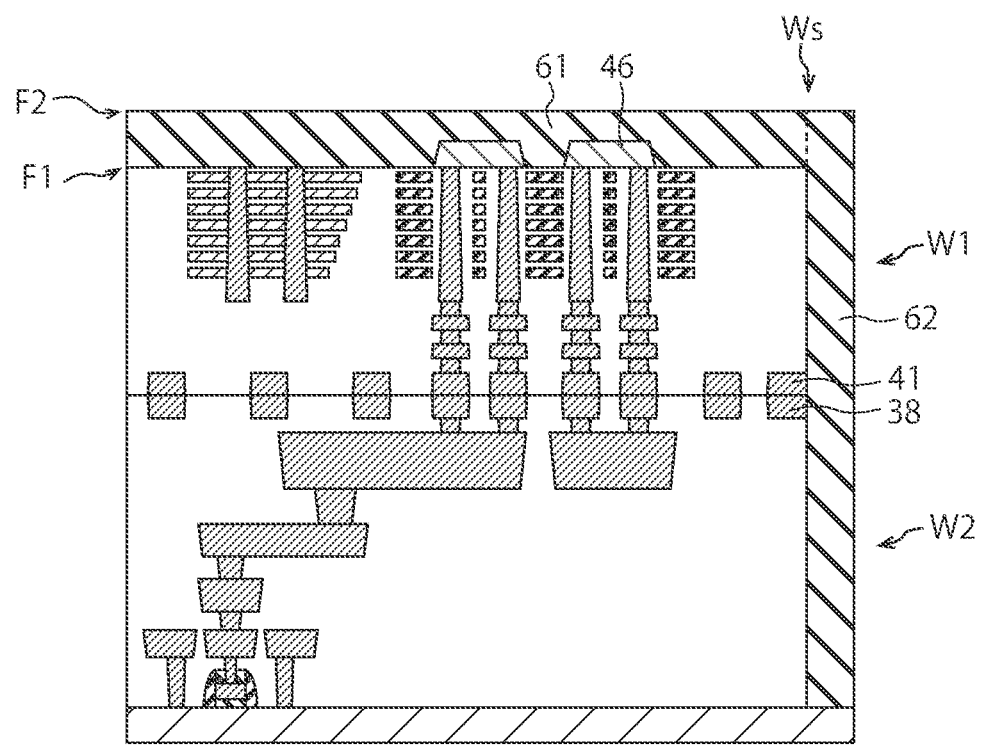
FIG. 26 is a cross-sectional view illustrating the method of manufacturing the semiconductor device, continued from FIG. 25.

Next, as illustrated in FIG. 26, the upper face of the insulating layer 63 is polished by CMP until the thickness of the insulating layer 61 becomes a desired thickness. In the fifth embodiment, the insulating layer 63 is not separated into the insulating layer 61 and the insulating layer 62 unlike in the first embodiment. That is, in the fifth embodiment, the insulating layer 61 to be provided on the interlayer dielectric 13 and the insulating layer 62 to be provided on the side faces Ws are also formed concurrently. The insulating layer 62 is provided so as to cover the connected portion of the array wafer W1 and the circuit wafer W2 along the side faces Ws thereof. That is, the metal pads 38 and 41 remain covered with the insulating layer 62 after the polishing of CMP.

Figure 27:
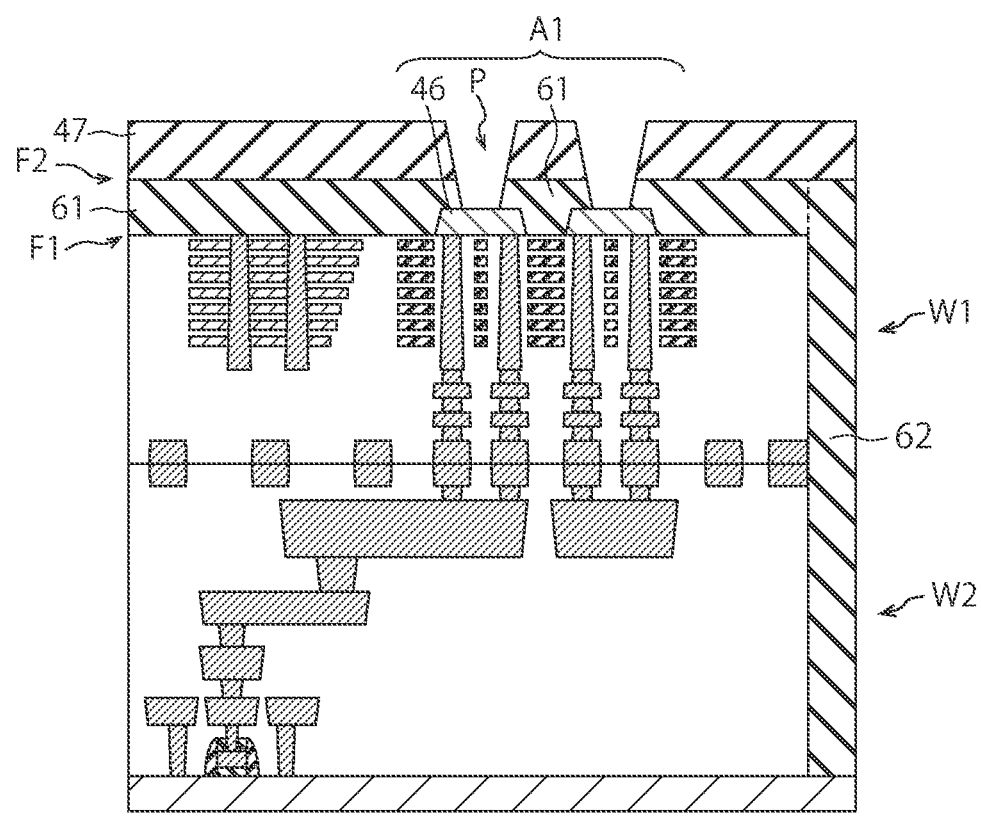
FIG. 27 is a cross-sectional view illustrating the method of manufacturing the semiconductor device, continued from FIG. 26.

Next, as illustrated in FIG. 27, the passivation film 47 is formed on the face F2 that is the upper face of the insulating layer 61. For example, thick resist, such as PI (Polyimide), is applied, and then, exposure, development, and RIE process are performed thereon. Accordingly, the opening P for exposing the metal pads 46 can be formed. After that, the thus obtained bonded wafers are cut into individual pieces, so that the semiconductor device of FIG. 21 is completed.

As described above, according to the fifth embodiment, the metal pads 46 are provided in the pad opening P of the insulating layer 61 in the region A1 where wire bonding is to be performed. In addition, the structural body 18 is provided between the face F1 and the bonded face S in the region A1. The structural body 18 has a high strength, and thus can suppress the influence of mechanical stress that would be applied to the semiconductor device during wire bonding. Accordingly, even when wire bonding is performed on the metal pads 46 immediately above the via plugs 45, the influence of mechanical stress to be applied to the via plugs 45 and the like can be suppressed. Further, since stress to be applied during wire bonding need not be considered, design flexibility of the semiconductor elements, wires, and the like can be improved. It should be noted that after the wire bonding, the opening P and the bonded wires may be covered with a protective film of polyimide or resin, for example.

(Supplement)

The present embodiment includes the following aspect.

A semiconductor device including:
    a first chip having a memory cell array; and
    a second chip joined to the first chip and having a control circuit, the control circuit being configured to control the memory cell array,
    in which:
        the first chip includes
        a first insulating layer arranged on the side opposite to a joined face of the first chip joined to the second chip, the first insulating layer including a first face, a second face on the side opposite to the first face, and a connection terminal region in a first region, the memory cell array being provided between the first face and the opposed joined face,
        a connection terminal provided in the connection terminal region such that the connection terminal is at least partially exposed,
        a first structural body provided between the first face and the joined face, the first structural body being electrically connected to the connection terminal,
        a second structural body provided between the first face and the joined face in the first region, and
        an interlayer dielectric provided between a first stack and the first structural body,
        a material of the second structural body and a material of the interlayer dielectric are different,
        the connection terminal electrically connects the first chip to an external power supply,
        the memory cell array includes
        a first stack including a plurality of conductive layers and a plurality of insulating layers alternately stacked in a first direction perpendicular to the first face, and
        a first columnar portion provided along the first direction so as to be connected to the first stack, and the second structural body includes a plurality of second columnar portions provided along the first direction.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first chip having a memory cell array; and
a second chip joined to the first chip and having a control circuit, the control circuit being configured to control the memory cell array,
wherein:
the first chip includes
a first insulating layer arranged on a side opposite to a joined face of the first chip joined to the second chip, the first insulating layer including a first face, a second face on a side opposite to the first face, and a connection terminal region in a first region, the memory cell array being provided between the first face and the opposed joined face,
a connection terminal provided in the connection terminal region such that the connection terminal is at least partially exposed,
a first structural body provided between the first face and the joined face, the first structural body being electrically connected to the connection terminal,
a second structural body provided between the first face and the joined face in the first region, and
an interlayer dielectric provided between a first stack of the memory cell array and the first structural body,
the connection terminal and the second structural body have portions overlapping each other as seen in a top view,
a material of the second structural body and a material of the interlayer dielectric are different, and
the connection terminal electrically connects the first chip to an external power supply,
wherein:
the first structural body includes a plurality of first structural bodies provided below the connection terminal, and
the second structural body is provided around the plurality of first structural bodies.

2. The semiconductor device according to claim 1, wherein:
the first chip includes a first bond pad located on the joined face,
the second chip includes a second bond pad located on the joined face, and
the first bond pad and the second bond pad are electrically connected.

3. The semiconductor device according to claim 2, wherein the first structural body is provided at a position overlapping the connection terminal and the second bond pad as seen in a top view.

4. The semiconductor device according to claim 1, wherein the first chip further includes a substrate arranged on a side opposite to the face of the first chip joined to the second chip, the substrate including a third face,
a fourth face on a side opposite to the third face, and
an opening extending from the fourth face to the third face in the first region, the first insulating layer being provided in the opening, the memory cell array being provided between the third face and the opposed joined face.

5. The semiconductor device according to claim 1, wherein:
the memory cell array has a first stack including a plurality of conductive layers and a plurality of insulating layers alternately stacked in a first direction perpendicular to the first face, and
the second structural body has a third stack including a plurality of metal layers and a plurality of insulating layers alternately stacked corresponding to the first stack, the plurality of metal layers being insulated from the first structural body.

6. The semiconductor device according to claim 5, wherein:
a material of the metal layers of the third stack is the same as a material of the conductive layers of the first stack, and
a material of the insulating layers of the third stack is the same as a material of the insulating layers of the first stack.

7. The semiconductor device according to claim 4, wherein the first insulating layer is provided in the opening in a region from the third face to the fourth face.

8. The semiconductor device according to claim 4, wherein:
the first chip is provided in a first wafer,
the second chip is provided in a second wafer,
a second insulating layer is further provided to cover a connected portion of the first wafer and the second wafer along side faces of the first wafer and the second wafer, and
a material of the second insulating layer is the same as a material of the first insulating layer provided in the opening so as to allow the connection terminal to be at least partially exposed on a side of the fourth face of the substrate in the first region.

9. The semiconductor device according to claim 1, wherein the connection terminal is electrically connected to a bonding wire by wire bonding in the first region.

10. The semiconductor device according to claim 4, wherein the connection terminal is provided along the third face in the opening.

11. The semiconductor device according to claim 4, wherein the connection terminal is provided between the third face and the fourth face.

12. A semiconductor device comprising:
a first chip having a memory cell array; and
a second chip joined to the first chip and having a control circuit, the control circuit being configured to control the memory cell array,
wherein:
the first chip includes
a first insulating layer arranged on a side opposite to a joined face of the first chip joined to the second chip, the first insulating layer including a first face, a second face on a side opposite to the first face, and a connection terminal region in a first region, the memory cell array being provided between the first face and the opposed joined face, a connection terminal provided in the connection terminal region such that the connection terminal is at least partially exposed,
a first structural body provided between the first face and the joined face, the first structural body being electrically connected to the connection terminal,
a second structural body provided between the first face and the joined face in the first region, and
an interlayer dielectric provided between a first stack of the memory cell array and the first structural body,
the connection terminal and the second structural body have portions overlapping each other as seen in a top view,
a material of the second structural body and a material of the interlayer dielectric are different, and
the connection terminal electrically connects the first chip to an external power supply,
wherein:
the memory cell array has a first stack including a plurality of conductive layers and a plurality of insulating layers alternately stacked in a first direction perpendicular to the first face, and
the second structural body has a second stack including a plurality of insulating layers alternately stacked corresponding to the first stack, the number of the insulating layers of the second stack being identical to a sum of the number of the plurality of conductive layers and the number of the plurality of insulating layers of the first stack.

13. The semiconductor device according to claim 12, wherein the second stack is provided so as to be in contact with the first structural body.

14. The semiconductor device according to claim 12, wherein:
the second stack includes two types of insulating layers, and
a material of one of the two types of insulating layers is the same as a material of each of the insulating layers of the first stack.

15. A method of manufacturing a semiconductor device, comprising:
forming a first stack in a memory cell array region on a third face of a substrate that includes the third face and a fourth face on a side opposite to the third face, and forming a first structural body and a second structural body as a second stack in a first region on the third face;
joining a first wafer and a second wafer together, the first wafer having the substrate, the second wafer having formed therein a control circuit that is configured to control the memory cell array;
forming an opening extending from the fourth face to the third face of the substrate in the first region;
forming in the opening a connection terminal to be electrically connected to the first structural body; and
forming a third insulating layer covering the fourth face of the substrate, the opening, and side faces of the first wafer and the second wafer, and polishing the third insulating layer until the fourth face of the substrate is exposed, thereby forming a first insulating layer in the opening and forming a second insulating layer on the side faces.

16. The method of manufacturing the semiconductor device according to claim 15, further comprising:
polishing the side faces of the first wafer and the second wafer before forming the third insulating layer; and
forming the first insulating layer in the opening and forming the second insulating layer on the side faces at a connected portion of the first wafer and the second wafer, thereby covering the connected portion of the first wafer and the second wafer.

17. The method of manufacturing the semiconductor device according to claim 15, further comprising forming the second structural body concurrently with the first stack of the memory cell array.

* * * * *